United States Patent [19]
Ierymenko

[11] Patent Number: 6,023,193
[45] Date of Patent: Feb. 8, 2000

[54] HIGH POWER BRIDGE AMPLIFIER

[75] Inventor: Paul F. Ierymenko, Foothill Ranch, Calif.

[73] Assignee: QSC Audio Products, Inc., Costa Mesa, Calif.

[21] Appl. No.: 09/071,307

[22] Filed: May 1, 1998

[51] Int. Cl.[7] .................................................. H03F 3/45
[52] U.S. Cl. ........................................ 330/255; 330/146
[58] Field of Search .................................. 330/252, 255, 330/146

[56] References Cited

U.S. PATENT DOCUMENTS

| | | | |
|---|---|---|---|
| 2,821,639 | 1/1958 | Bright et al. | 307/88.5 |
| 3,383,613 | 5/1968 | Novak | 330/146 |
| 3,808,545 | 4/1974 | Stanley | 330/146 |
| 4,611,180 | 9/1986 | Stanley | 330/146 |
| 4,673,889 | 6/1987 | Cini et al. | 330/10 |
| 4,716,379 | 12/1987 | Davis | 330/252 |
| 5,119,041 | 6/1992 | Hanna | 330/252 |
| 5,424,683 | 6/1995 | Takahashi | 330/255 |
| 5,442,318 | 8/1995 | Badyal et al. | 330/253 |
| 5,513,094 | 4/1996 | Stanley | 363/98 |

*Primary Examiner*—Robert Pascal
*Assistant Examiner*—Khanh Van Nguyen
*Attorney, Agent, or Firm*—Harold L. Jackson

[57] ABSTRACT

A balanced bridge (full or half) power transconductance amplifier utilizes an input voltage signal to control current converter, in the form of a differential circuit, to derive a pair of control currents representative of the input signal and a load current monitoring signal. The converter includes a current input terminal which responds to a current representative of the load impedance for reducing the amplitude of the control currents (and the bridge current) due to an impermissibly low load impedance. A class A to class B converter responds to the control currents to provide a pair of discontinuous bridge drive currents with each drive current being proportional to the difference in the control currents during respective half cycles. A differential amplifier steers the bridge drive currents to respective legs of a full bridge in response to the voltages across the power supply terminal and the load to reduce any bridge unbalance. A reactive load control circuit in the form of a differential transistor circuit is coupled to the differential amplifier to disable an appropriate leg of the bridge and effectively disconnect the power supply when the polarity of the load current is opposite to the polarity of the load voltage. An operational (error) amplifier may be coupled to the input of the transconductance amplifier to form a composite voltage amplifier with circuitry limiting the gain of the operational amplifier at high frequencies and/or limiting the excursion of the input signal to minimize the effects of clipping.

41 Claims, 12 Drawing Sheets

HIGH POWER BRIDGE AMPLIFIER

FIELD OF THE INVENTION

The present invention relates to amplifiers and more particularly to bridge amplifiers (half or full) for driving a load such as an audio speaker system.

BACKGROUND OF THE INVENTION

Modern large-venue speaker systems used, for example, in theaters and concert halls, often require three or more kilowatts of audio power. The amplifiers available which meet such high power requirements are not only very large and heavy, but generally have limited capability of producing high frequency signals and higher harmonic distortion than low power amplifiers. In addition, the prior art high power amplifiers have shortcomings with respect to circuitry for (a) generating drive control and monitoring signals; (b) handling abnormal operating condition such as overload leading to system failure; and (c) handling reactive loads with minimum power dissipation.

The generation of monitoring signals is essential for remote system monitoring which is a new, but a growing requirement in modern multiple amplifier sound reinforcement systems. To achieve this, signals conveying information about the internal state of the amplifier must be developed within the amplifier and presented to an external interface. The creation of a monitor signal that represents the current delivered by the amplifier to its load has necessitated the use of shunts or current transformers and measurement circuitry dedicated to that purpose. Such shunts or transformers add to the cost.

Conventional power amplifiers do not use explicit drive control signals for controlling the separate bridge elements in a class B mode, for example. As a result, circuitry to protect the amplifier becomes more complex.

Prior art bridge audio amplifiers are disclosed in U.S. Pat. No. 3,808,545 which issued to G. Stanley in 1986, U.S. Pat. No. 3,383,613 which issued to J. F. Novak in 1968, and U.S. Pat. No. 2,821,639 which issued to R. L. Bright et al in 1958. Such amplifiers have one or more of the above shortcomings.

There is a need for a high power amplifier capable of reproducing signals over an extended bandwidth with low harmonic distortion which overcomes the shortcomings of the prior art amplifiers.

OBJECTS AND SUMMARY OF THE INVENTION

A power amplifier (sometimes referred to as a core amplifier) in accordance with the present invention employs a plurality of operational current amplifiers connected in a bridge (full or half) having unitary current manipulation and drive means that together translate a differential voltage input and a current input into an amplified output current that is a linear function of the input voltage and that has a maximum magnitude bounded by and proportional to an input current. Both negative feedback and an error amplifier may be employed to transform the power amplifier's transfer function into a linear amplifier having voltage controlled voltage source output with high power capability. A voltage proportional to the amplifier's output current is developed for monitoring purposes. Protection circuits intervene to prevent overload and other destructive conditions from occurring. A floating power supply provides electrical power to two opposite terminals of the bridge and the load is connected between the remaining two opposite terminals.

The operational current controlled current sources may be arranged in quadrature to form a full-bridge amplifier. Each element may comprise an integrated circuit operational amplifier arranged to drive a power transistor as a current pass element with precision gained through local feedback. The power transistor may be a Metal Oxide Field Effect Transistor, (MOSFET), an Insulated Gate Bipolar Transistor, (IGBT), a Bipolar Junction Transistor, (BJT), or any similar device that is capable of linear amplification. Although used in a somewhat novel way in the present invention, this particular circuit function is well known and described in the prior art. It will hereafter be referred to as a "current cell".

The voltage input, which may come from the output of an error amplifier (forming a composite amplifier with the core amplifier) or may be simply the input signal, is applied to a transistor differential stage that is biased by a controlled current source. The product of the current from the source and the applied differential voltage appears as two balanced differential currents that can span an arbitrary voltage gradient. These balanced currents are applied to a further differential current mirror stage that is, in the preferred embodiment of this invention, referenced to the most negative terminal of the bridge power supply. Further stages produce currents to control the bridged current cells that drive the load. The currents in all these stages and current cells have magnitudes bounded by the signal presented to the current control terminal, thus achieving this object of the invention.

It is also an object of the invention that a voltage proportional to the load current be derived from the natural operation of the circuit with no need of explicit current measurement means. This objective is achieved by the use of amplifier circuitry having very linear behavior and well-defined finite transconductance, i.e, preset gain, so that the input signal to the amplifier has fidelity suitable to the intended current-monitoring application. A further benefit of the invention is that, when negative feedback is employed around said amplifier, the input signal can also serve as a diagnostic signal showing the amplifier's transfer function errors.

A collateral and desirable consequence of such a linear forward signal path is that faithful reproduction of audio signals may be achieved without employing a large amount of negative feedback. The output impedance of the amplifier is defined by the amount of negative feedback and may be set to useful values bounded by but not, of course, including zero and infinity.

It is yet another object of the present invention to convert a single or balanced current or voltage that is a continuous scaled representation of the input signal, into a pair of discontinuous currents having the property that, taking their difference, restores a continuous scaled representation of the original signal. A nonlinear differential circuit develops drive currents for the bridge output elements so as to operate the bridge in the mode known as "class B".

It is a further object of the invention that the transition between the pair of drive currents discussed above be made gradual rather than abrupt in such a way that the commutation of load current that occurs in a class B amplifier be made smooth, as this improves system fidelity. There are many functions having the correct properties, but the function disclosed herein is one that may be realized in a readily constructed circuit as a natural consequence of transistor action.

It is also an object of the invention that for a full bridge arrangement, the four sets of drive currents corresponding to the four current cells comprising the bridge power output stage be derived by steering a single well-defined current. Adhering to this has the consequence that the same current cannot be directed to one leg of the bridge without first having been redirected away from the other leg of the bridge. This results in a circuit topology that is naturally free from unscheduled and potentially destructive current flows along paths that do not pass through the load.

It is another object of the invention that the idle current and bias point of the amplifier be controlled directly and electronically rather than through thermal feedback as is the case in conventional amplifiers. This will be desirable in most embodiments of the present invention because there may be a plurality of heat sinks and so a plurality of sensor means would have to be employed to achieve conventional thermal feedback. Also, the thermal sensing delays inherent in conventional methods can cause the operating point to wander about the optimum due to quickly varying stresses imposed by dynamic program material such as musical signals.

It is a still further object of the invention that the drive currents applied to the current cells have the property that they never diminish completely to zero but retain some small minimum current at all times. A small fixed control current causes each current cell comprising the bridge to remain minimally biased into its linear operating region even when not supplying current to the load. As a linear control system, each current cell would otherwise be subject to current perturbations during settling time as each recovered feedback stability in preparation for supplying current to the load, and this would increase what is commonly called crossover distortion.

It is yet another object of the invention that the steering of bridge drive currents be dynamically modified when the amplifier's load is at least partly reactive to reduce the power dissipated within the amplifier and to demand less power from the power supply.

To the degree that a load is reactive, its current and voltage will, at certain times, be of opposing polarity. In the present invention this distinct circumstance is detected and means are provided to disengage the power supply from the load for its duration so that the energy stored in the reactive portion of the load is efficiently dissipated in only half of the bridge and there is no drain on the power supply. This mode of operation will be referred to as "reactive discharge" in the forthcoming detailed explanation of the preferred embodiment.

An additional object of the invention is that the reactive discharge mode of operation described above may be disabled at lower system temperatures and enabled only when the system temperature rises to an arbitrary threshold so that the increased distortion characteristic of this mode of operation can be avoided when the load is light and the system is cool.

It is even further a object of the invention that the bridge be caused to remain in balance while in operation so that the voltage and power stress is, within an acceptable deviation due to circuit tolerances, equally apportioned between the plurality of bridge current cells.

Bridge drive currents are divided between active bridge current cell elements in a controlled manner designed to ensure that the load remains electrically centered within the bridge. This is achieved by comparing the sum of the power supply terminal voltages with the sum of the load terminal voltages and dynamically adjusting the bifurcation of the bridge drive currents between bridge current cell elements to minimize the comparison.

It is an object of the present invention to provide an additional defense against unexpected currents flowing through the bridge current cells but not through the load. Such currents could occur as a consequence of damaged components in other parts of the system or if the system becomes self-oscillatory or chaotic. Since all large valid bridge currents flow through the load, these valid currents are sensed and a control signal dependent on their presence is developed and applied to bridge current cells that are inactive at the time these valid currents are present. Said control signals act to reduce the maximum current that these inactive cells could pass, were they to become active at the wrong time due to some disturbance or component failure in the system.

The core amplifier described above has no overall feedback and has large and well-defined transconductance, i.e., preset gain. One characteristic of such a circuit is that its voltage gain is a direct function of its load impedance, with the corollary that its output impedance is high. In some applications, this may be exactly what is desired and the present invention will perform this function with good linearity, but for the reproduction of audio through conventional speaker systems the amplifier's characteristic should be that of a voltage controlled voltage source.

It is well known that a transconductance amplifier can be transformed to a voltage amplifier by the application of negative feedback. In the present invention, negative feedback can be applied through a suitable feedback attenuation network directly to the inverting voltage input of the first differential stage. However, the resulting loop gain and DC accuracy of the core amplifier may not be sufficient for the purposes intended, so it is advantageous to incorporate an error or servo amplifier, which may be an operational amplifier, to amplify the difference between the input signal and the attenuated output signal and to present the resulting error signal to the input of the core amplifier for the purpose of reducing the error.

The resulting composite amplifier can have very high loop gain and low offset errors, but may be unstable unless the servo amplifier's gain is confined to a region of frequency where the sum of all phase shifts does not violate the criteria for stability. It is a well known technique to apply capacitive feedback locally around the error amplifier, thus forming an integrator with frequency dependent gain, but this technique has some drawbacks.

In most applications a power amplifier is sometimes called upon to deliver a signal having peak values that exceed the available maximum supply voltage, resulting in a phenomenon known as clipping. In a composite amplifier having an error amplifier stage configured as an integrator, the loss of feedback that results at the time of clipping causes the error to be large and this large input to the integrator will often cause it to ramp to the limit of its excursion and saturate there. Consequently, after clipping when the input signal drops to a voltage that could be reproduced by the amplifier, the error amplifier must ramp back to its proper control point before the amplifier can continue to reproduce the signal. This lag or "recovery time" of the servo results in a significant additional distortion of the signal after clipping and is undesirable.

It is an object of the present invention to overcome the problem of servo saturation recovery by two different circuitry configurations either or both of which may be used in various embodiments of the invention.

The first configuration senses the approach of clipping by a threshold sensor and employs an electronic switch to reduce the gain of the error amplifier's integrator to zero whenever the signal is above this threshold. In order for this to work, the signal must be connected to the composite amplifier such that the action of this switch does not disable all of the system's loop gain but only the gain contributed by the servo amplifier. Thus, during clipping and slightly before and after clipping, the loop gain is temporarily reduced to what it would have been without the error amplifier integrator gain and the signal traverses through clipping without ramping or saturating the integrator. When the signal passes out of clipping and falls below the threshold, integrator gain and therefore system loop gain is restored, but there is no additional recovery time because the integrator output does not need to ramp to the correct voltage; it is already at the correct voltage, having been held there for the duration of the clipping event by the action of the electronic switch.

In the second configuration, the voltage excursions of the input signal are clamped to a pair of suitably polarized reference voltages that represent the maximum supply voltage scaled down by a factor equal to the closed loop gain of the overall composite amplifier. In consequence, the bridge or core amplifier is never allowed to receive a signal so large that it cannot be accurately reproduced and error amplifier saturation cannot occur.

A further benefit of the second configuration is that the damping of the system remains constant throughout all signal excursions because the loop gain is never interrupted. Consequently, the amplifier maintains full control of reactive loads, even when the signal appears to be clipping.

It is a further object of the invention that the reference voltages used in the clamping scheme of error amplifier control described above be made responsive to the current passing through the load so that larger load currents reduce the clamping reference thresholds commensurately with the increased voltage drops in the current cells. The overall result is that clamping accuracy is corrected for variations in circuit voltage drops due to load currents.

It is another object of the present invention to provide protection circuitry to first limit and then gradually reduce the amplifier's output current in response to any load impedance that would cause a violation of the safe operating area of the power output devices.

This circuit detects when a suitably scaled representation of the load current exceeds a scaled representation of the load voltage, integrates the same, and initiates a reduction in the bridge current by reducing, in proportion to the integral, the input to the current control terminal of the transconductance core amplifier. The scaling of the load current is made such that its magnitude will exceed the scaled load voltage magnitude sufficiently to effect current protection only when the load impedance is lower than a selected permissible impedance. The novel protection circuit disclosed herein has the desirable attributes of being sensitive to both the amplitude and the phase of the load current and of acting with increased speed for shorted and nearly shorted loads.

The present invention may be best understood by reference to the following description taken in conjunction with the accompanying drawings in which like components, signal lines and terminals are given the same reference numerals throughout the several figures.

DESCRIPTION OF THE PREFERRED EMBODIMENT

Figure 1:
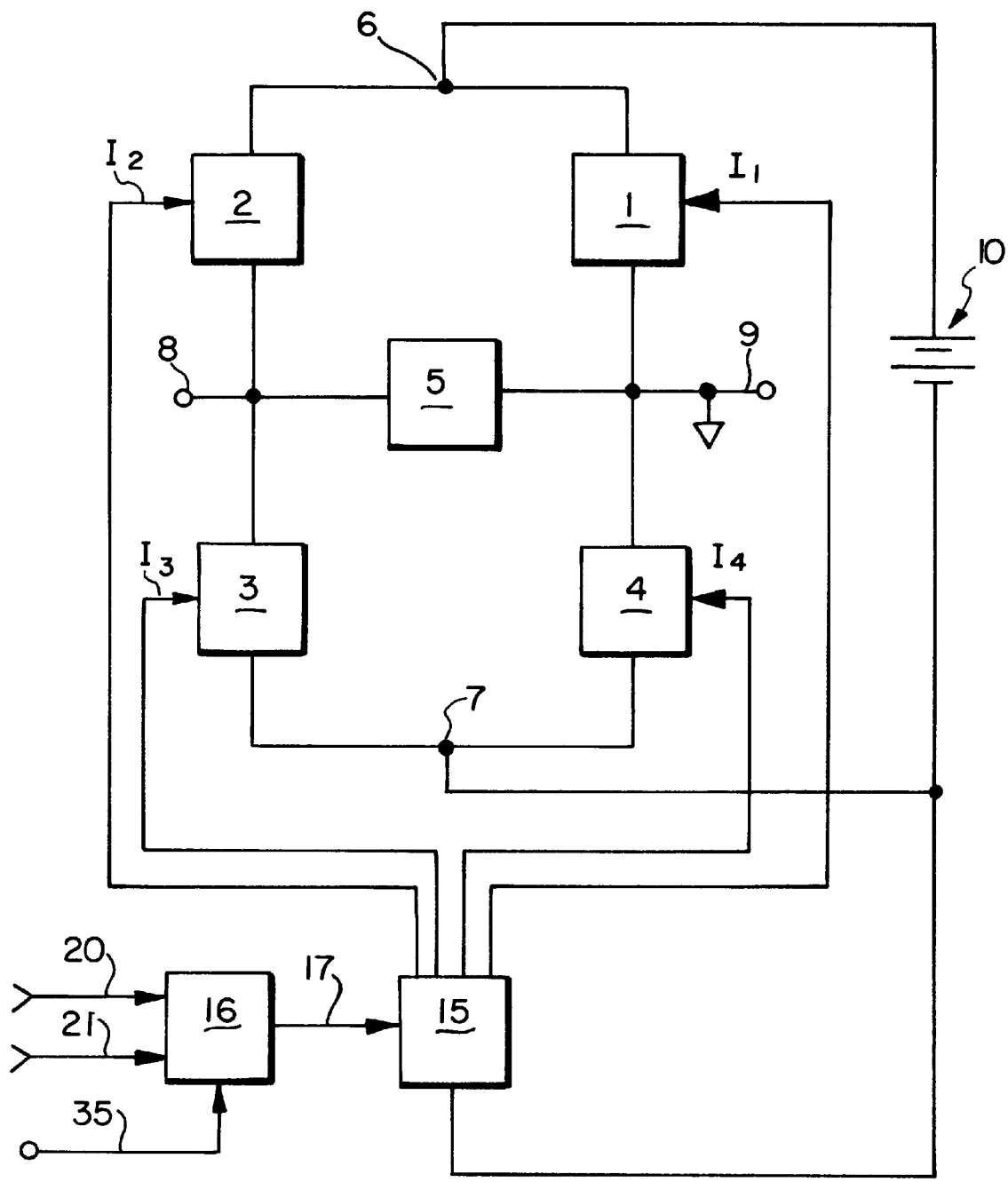
FIG. 1 is a block diagram of a core bridge amplifier in accordance with the present invention.

FIG. 1 is a block diagram of a full bridge transconductance amplifier (i.e., a core amplifier) showing the basic arrangement of elements. An input voltage signal to control current converter, in the form of a differential amplifier 16 (to be explained with respect to FIG. 2), receives the input signal in the form of differential voltage signals on terminals 20 and 21. See waveform $V_1$ of FIG. 10A. A control current, to be explained, is applied to terminal 35.

The output signal in output 17 may be a single current or a balanced differential current carried over two lines. See output lines 17a and 17b in FIG. 2. The output control current(s) in output 17 is applied to a current steering and shaping circuit 15. Circuit 15 develops drive currents $I_1$, $I_2$, $I_3$, $I_4$ which are applied to current cells 1, 2, 3, 4 respectively. Current cells 1, 2, 3, 4 are arranged in a full bridge configuration 4 with power supply terminals 6 and 7 connected to a power supply 10 and output terminals 8 and 9 connected across a load 5.

The side of the load connected to terminal 9, is shown as grounded because it is normally desirable for the load to be referenced to ground and it is usual for the signal on input terminals 20 and 21 to also be operated relative to ground.

It should be noted that the waveform diagrams of FIGS. 10–13 include exemplary values of current and voltages appearing at various points in the circuitry. The actual values will, of course, depend upon the particular components, resistance and voltage source values etc., which are selected.

Figure 2:
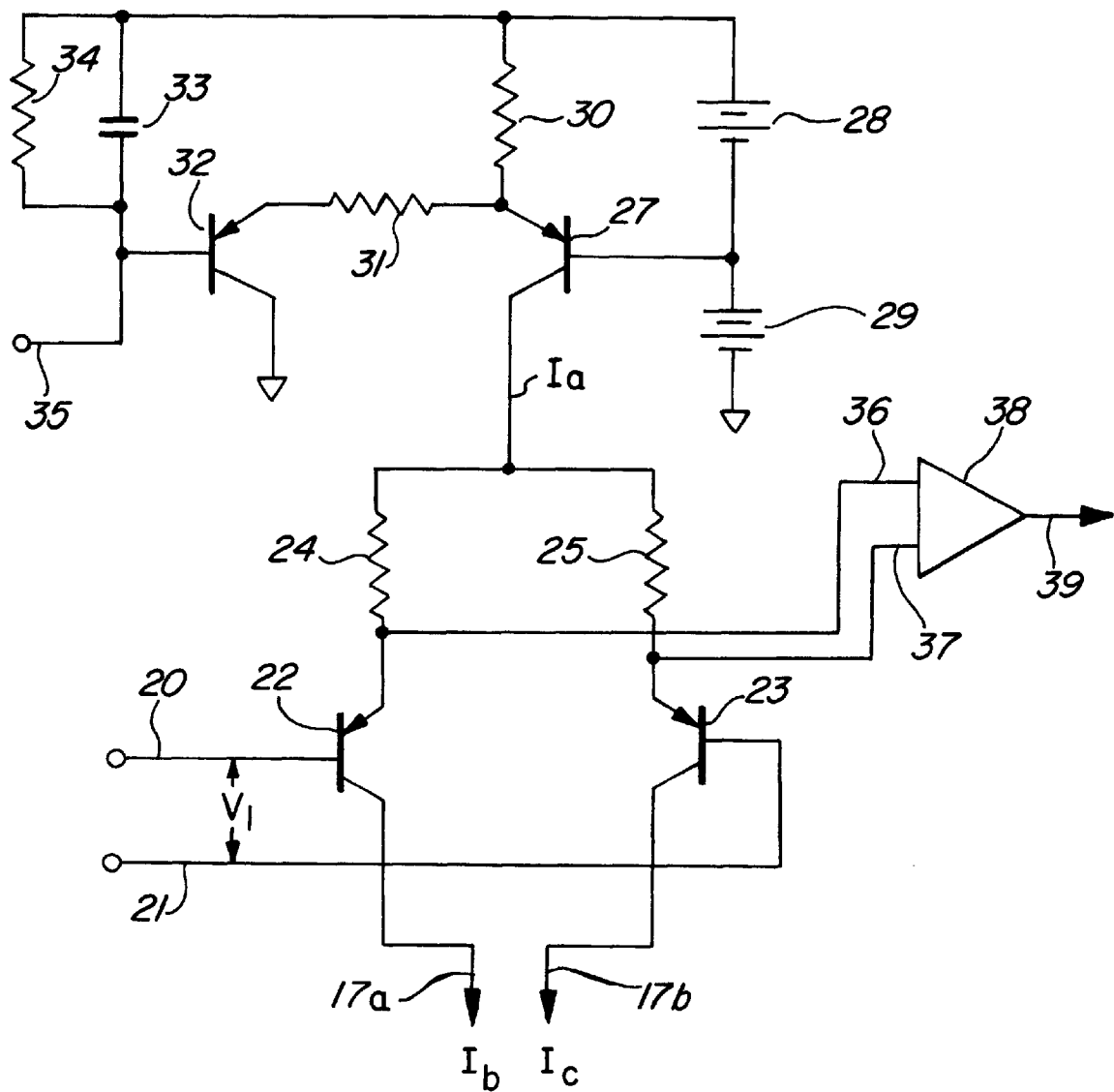
FIG. 2 is a schematic circuit diagram of an input voltage signal to control current converter suitable for use in the circuit of FIG. 1.

FIG. 2 is an expansion of the circuit 16 (input voltage signal to control current converter) shown in FIG. 1 illustrating common circuitry to achieve the desired function and provide control currents $I_b$ and $I_c$ on output lines 17a and 17b. FIGS. 10A and 10B provide a graphical view of the voltage and current waveforms discussed and should also be referred to. Current $I_a$, normally a constant current, is directed through resistors 24 and 25 and thereafter through the collector and emitters of transistors 22 and 23 with the proportion of current in each transistor varying as a function of the difference between the voltages on input terminals 20 and 21, i.e, $V_1$. The sum of currents $I_b$ and $I_c$ equals $I_a$. The difference of currents $I_b$ and $I_c$ therefore represents the product of current $I_a$ and the input voltage $V_1$ with magnitudes bounded by current $I_a$. $I_a$ is determined by the voltage of battery 28 and resistor 30, except when feedback current is applied as will be explained in reference to FIG. 9. Battery 29 raises the circuit voltage above ground sufficiently to accommodate the dynamic voltage range of the input signals.

A signal representative of the load current supplied by the transconductance amplifier can be obtained across the input terminals 20 and 21. A more accurate signal representative of the load current can be obtained through the use of an instrumentation amplifier 38 and the associated circuitry, i.e., resistors 24 and 25. Such circuitry eliminates the distortion resulting from changes in the junction impedance of the transistors with temperature. The input voltage to the transconductance amplifier may serve as a signal to monitor the load current.

The amplifier 38 can be of any standard design, for example, an amplifier that provides a high impedance on inputs 36 and 37 and a gain of about ten may be used. The output signal on output 39 is a voltage linearly proportional to the difference of the voltages on the input terminals 20 and 21 (i.e., $V_1$), but bounded by the product of resistance 24, (or 25) and current $I_a$. This yields a current monitoring function that accurately represents the load current, even when the limit of power amplifier output current has been reached. This contrasts with known methods that employ explicit sensors such as current transformers or shunt resistors to monitor the load current.

The remaining components shown in FIG. 2 provide means for varying $I_a$. When a sufficient amplitude of current has been drawn from input 35 for a sufficient duration to charge capacitor 33 and produce a voltage across resistor 34, transistor 32 variably diverts the current in resistor 30 through resistor 31 instead of transistor 27, thus reducing current $I_a$. This behavior of terminal 35 is suitable for effecting the current cutback function to be described in connection with FIG. 9.

Figure 3A:
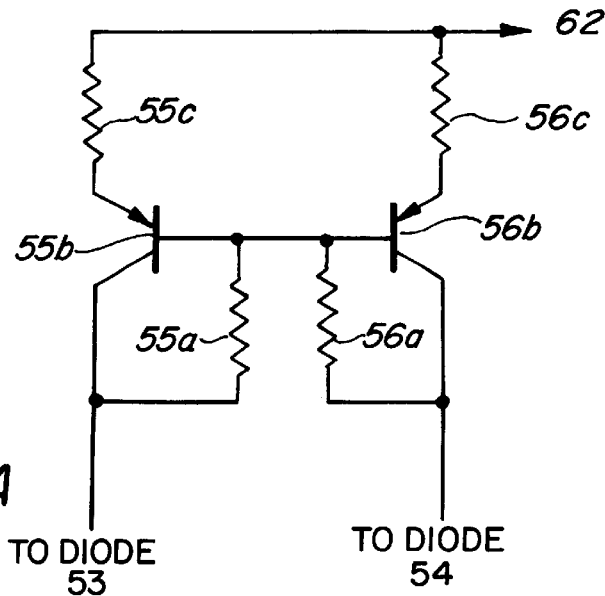
FIGS. 3A and 3B are schematic diagram of a class A to class B drive current converter suitable for use in the circuit of FIG. 1.
Figure 3:
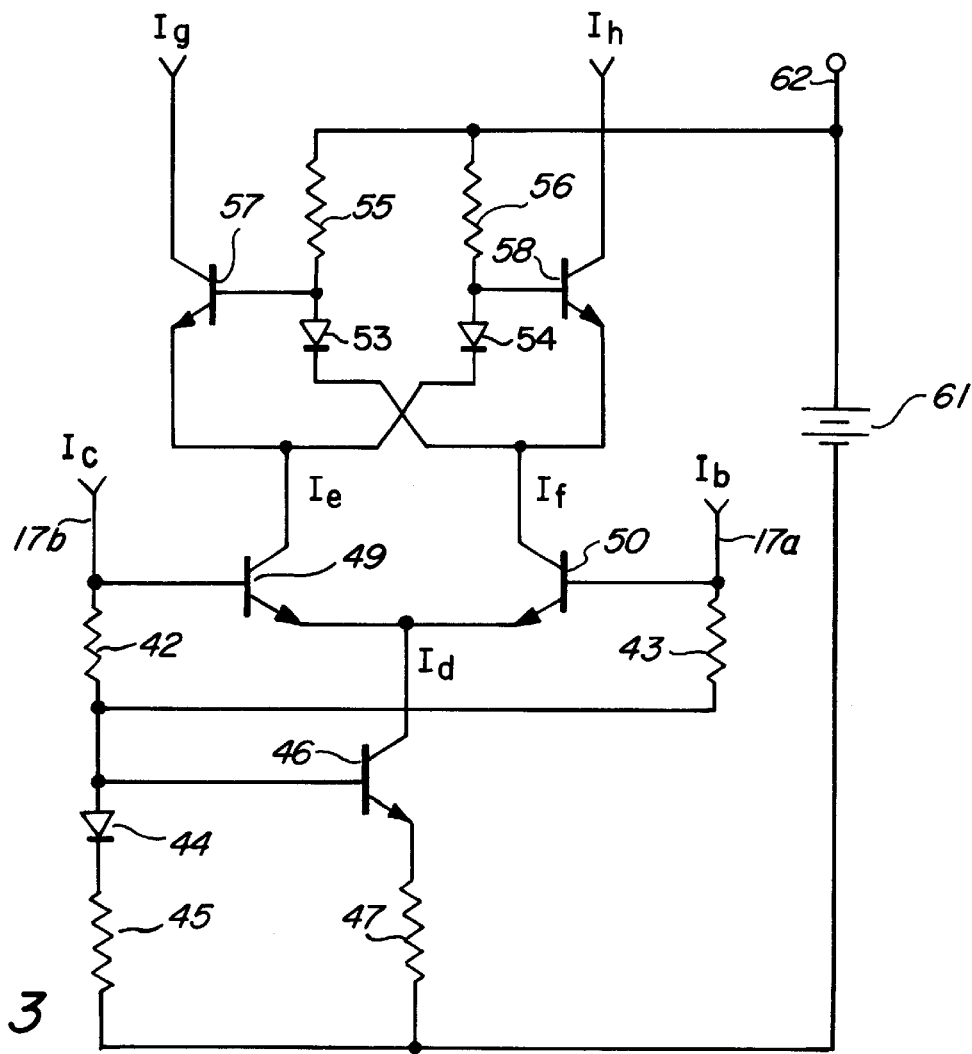
Figure 10A:
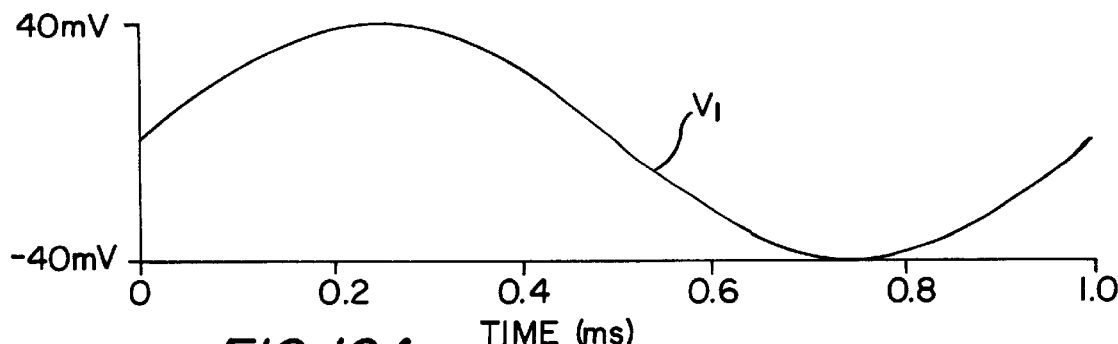
FIGS. 10A–10D, 11A–11D and 12 are diagrams illustrating the waveforms of the currents and voltage which appear at various points in the amplifier circuitry in response to an input voltage signal in the form of a sine wave.
Figure 10B:
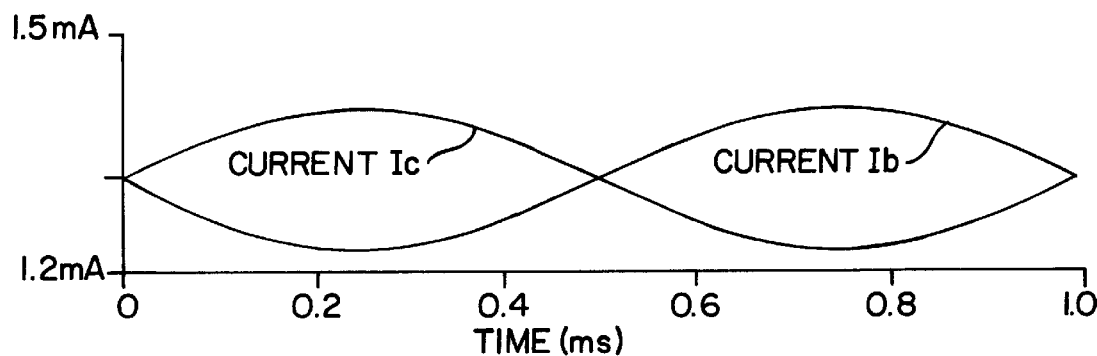
Figure 10C:
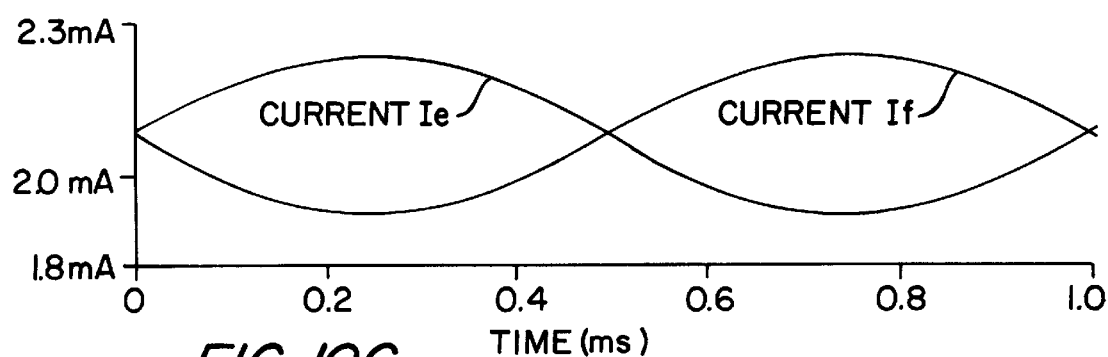
Figure 10D:
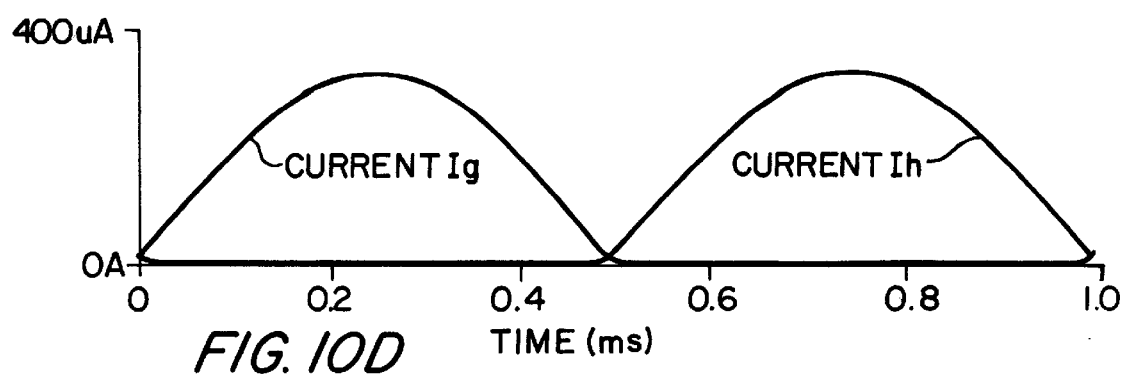
Figure 11A:
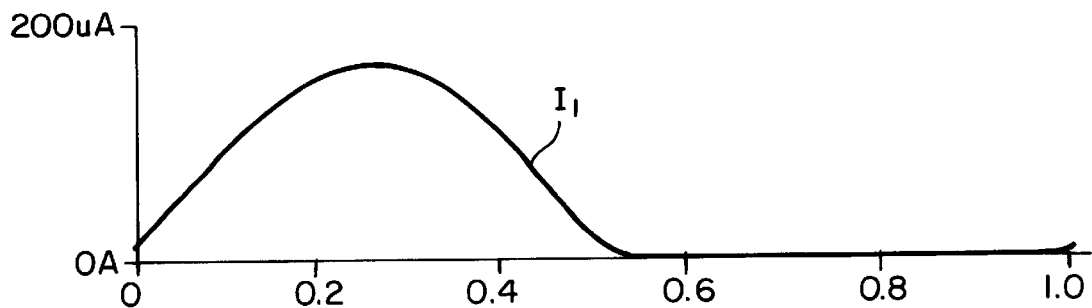
Figure 11B:
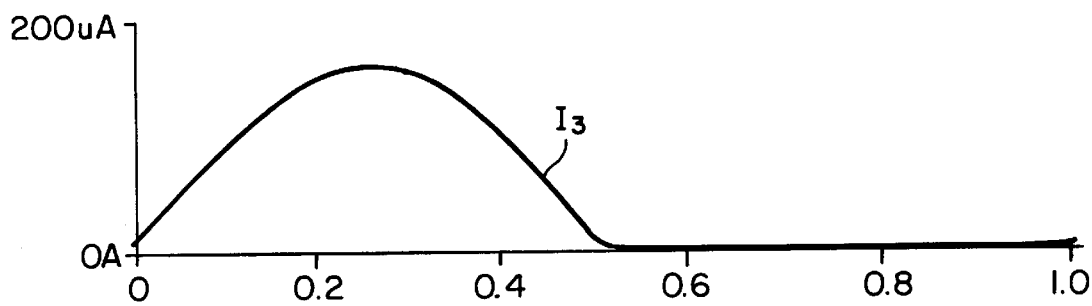
Figure 11C:
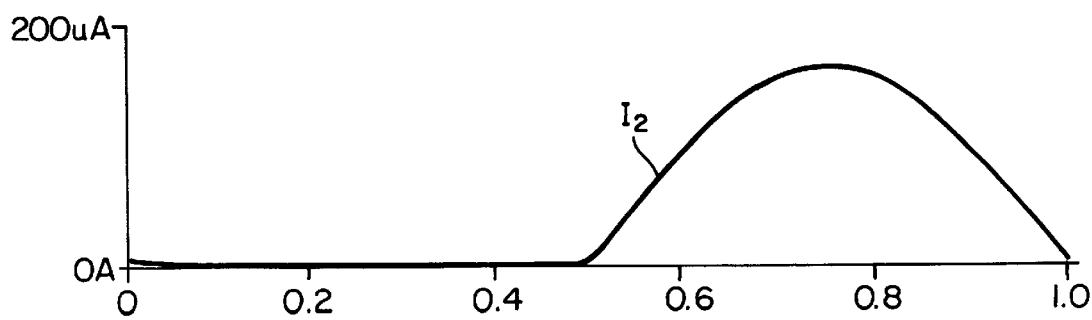
Figure 11D:
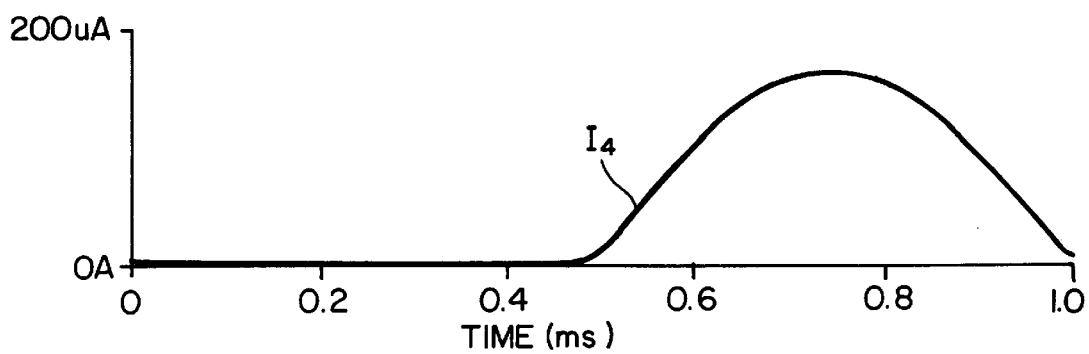

FIG. 3 illustrates circuitry (forming a part of the current steering and shaping circuit 15 of FIG. 1) for converting continuous balanced drive currents $I_b$ and $I_c$ into discontinuous class B currents $I_g$ and $I_h$. Voltage source or battery 61 provides a steady voltage of sufficient magnitude to ensure that all the active devices in the circuit remain out of saturation. FIGS. 10B–10D provides a graphical view of the voltage and current waveforms discussed and should also be referred to.

Currents $I_b$ and $I_c$ are summed through resistor 43 and 42, respectively, (on lines 17a and 17b) and expressed as a voltage across diode 44 and resistor 45 available to the base of transistor 46. Transistor 46 draws a normally constant current $I_d$ in proportion to the summed currents $I_b$ and $I_c$ but of opposite polarity and scaled by resistor 47. The bias current $I_d$ is applied to a differential amplifier composed of transistors 49 and 50 with the overall effect of producing currents $I_e$ and $I_f$ that are mirrored and scaled in relationship to currents $I_b$ and $I_c$. See FIG. 10.

Currents $I_e$ and $I_f$ are converted to class B currents via a nonlinear differential circuit comprising transistors 57 and 58 and associated components. Currents $I_e$ and $I_f$ are passed partly through transistors 57 and 58 and partly through junction compensation diodes 54 and 53 which part is expressed as voltages across resistor 56 and resistor 55 and presented to the bases of transistor 58 and transistor 57, all respectively. Transistors 57 and 58, therefore, are each able to control the other's collector currents $I_h$ and $I_g$, respectively. When currents $I_e$ and $I_f$ are equal, a state of equilibrium exists so currents $I_g$ and $I_h$ are also equal.

In equilibrium, the proportion of current $I_e$ that emerges at $I_g$ is a function of the difference in the voltage drops of diode 53 and of the base emitter junction of transistor 57. By controlling the ratio of junction sizes or by otherwise introducing the proper offset in said voltage drops it is possible to finely adjust the equilibrium point so that a minimal proportion of current $I_e$ appears as current $I_g$, the major part being diverted through diode 54. Since components 53, 55 and 57 are identical in value and function to their respective components 54, 56, and 58, the condition that current $I_g$ is equal to current $I_h$ at equilibrium is satisfied through symmetry.

When currents $I_e$ and $I_f$ depart from equilibrium, the effect of the previously described connection is to steer only that part of current $I_e$ that is greater than current $I_f$ to current $I_g$, or likewise to steer only that part of current $I_f$ that is greater than current $I_e$ to current $I_h$. This process comprises the desired conversion of class A currents to class B currents. Although the resulting currents $I_g$ and $I_h$ are each discontinuous, taking their difference restores a suitably precise continuous scaled analog of the difference between continuous currents $I_b$ and $I_c$.

The circuit arrangement also has the property that diodes 53 and 54 compensate for variations in the base-emitter voltages of transistors 57 and 58 with the consequence that the overall circuit's operation is invariant with temperature.

An improvement is shown in FIG. 3A. This improved circuit, including resistors 55a and 56a, transistors 55b and 56b, and resistors 55c and 56c replaces resistor 55 and resistor 56 in FIG. 3 and acts to greatly reduce the small error term in the output. This error is due to the finite differential impedance presented to the bases of transistor 57 and transistor 58 by the resistors 55 and 56, respectively. Replacing these resistors with the active network shown in the detail greatly raises the differential impedance there and reduces the error term correspondingly. Even more elaborate circuits may be employed to achieve greater improvements along this same path.

Figure 4:
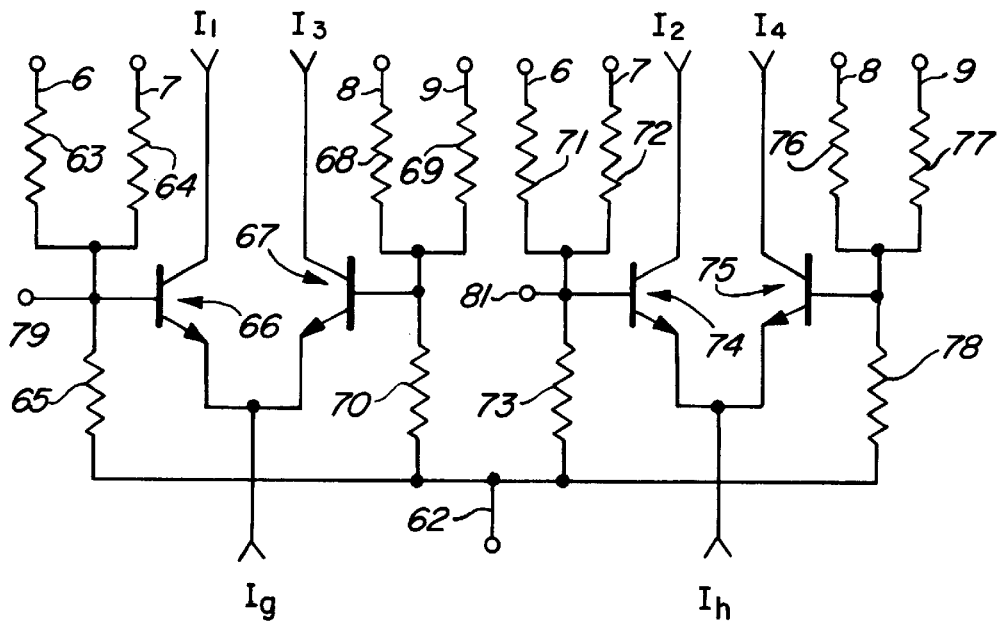
FIG. 4 is a schematic diagram of differential circuit for supplying drive currents to the cells of FIG. 1 to maintain the bridge in balance.

FIG. 4 illustrates circuitry (forming a portion of the current and shaping circuit 15 in FIG. 1) for applying class B currents $I_g$ and $I_h$ to the bridge and for maintaining the bridge in dynamic balance.

Currents $I_1$, $I_2$, $I_3$, and $I_4$ are the drive currents to current cells 1, 2, 3 and 4 respectively. (See circuit FIG. 1 and waveforms in FIGS. 11A–11D).

Transistors 66 and 67 comprise a differential amplifier that is capable of steering current $I_g$ between currents $I_1$ and $I_3$ in smooth proportion. Resistors 63 and 64 are connected to the positive and negative terminals 6 and 7 of the bridge power supply 10, so that a voltage representative of the center point of the bridge power supply appears at the base of transistor 66, scaled and referenced to terminal 62, the positive terminal of source 61, by resistor 65. Resistors 68 and 69 are connected across load 5, (see FIG. 1), at terminals 8 and 9 respectively, so that a voltage representing the center point of the load appears at their juncture, likewise superposed with the local voltage reference 62 by resistor 70 and appearing at the base of transistor 67. When the bridge is in dynamic balance, these base voltages are equal. Any inequality of said base voltages unbalance the differential stage composed of transistor 66 and transistor 67 and causes current $I_g$ to divide unevenly between currents $I_1$ and $I_3$ in a manner favoring the restoration of balance.

Figure 12:
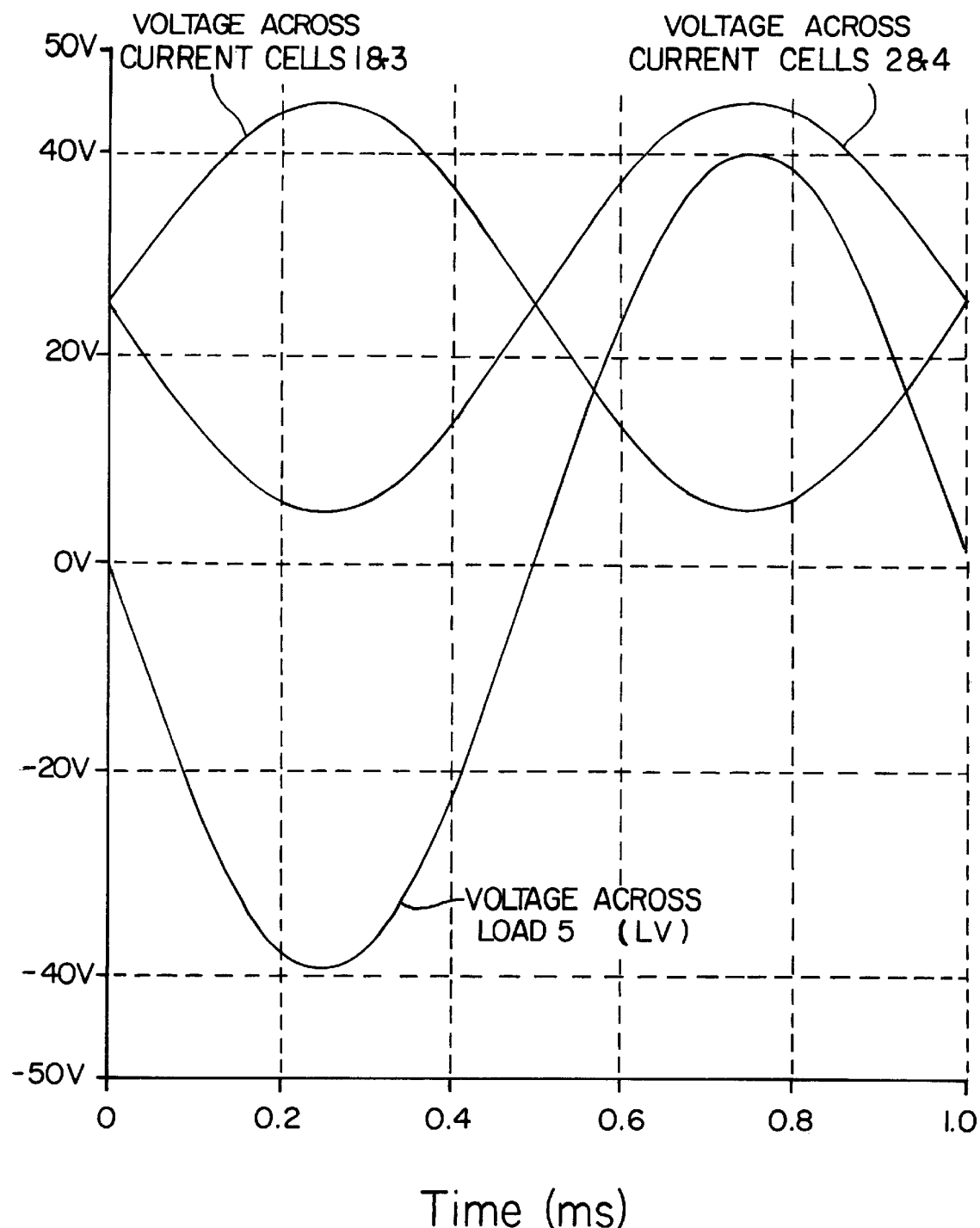

Thus, the class B drive current $I_g$ is apportioned between $I_1$ and $I_3$ by the bridge balance error to correct the bridge balance. In the same way, the class B drive current $I_h$ is apportioned between $I_2$ and $I_4$ to also correct the bridge balance. This is a negative feedback servo system for maintaining bridge balance that is orthogonal and transparent to the bridge's principal activity of amplifying the applied signal. FIG. 12 shows the output voltage of the amplifier and the corresponding voltages appearing across each current cell.

Note that the dynamic voltage across current cell 1 is the same as that across current cell 3 and the same applies to current cells 2 and 4. This shows that the bridge is in dynamic balance. Also note, that the single current $I_d$ of FIG. 3 has been progressively split into several paths and steered to the current cell drive currents $I_1$, $I_2$, $I_3$ and $I_4$. The sum of currents $I_1$, $I_2$, $I_3$ and $I_4$ cannot exceed $I_d$. Moreover, current $I_d$ cannot simultaneously appear at $I_g$ and $I_h$, therefore $I_1$ and $I_4$ cannot occur at the same time, nor can $I_2$ and $I_3$ occur at the same time. This arrangement promotes orderly and reliable control of the bridge.

Figure 5:
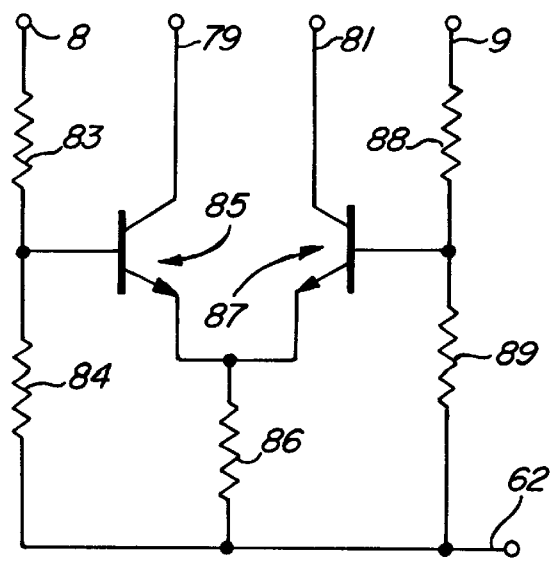
FIG. 5 is a schematic diagram of a circuit for reducing the dissipation of energy stored in a reactive load within the current cells of FIG. 1.

The circuit of FIG. 5 illustrates a reactive load control circuit which implements a mode of operation that increases the power handling efficiency of the invention by discharging the energy stored in a reactive load without having to oppose it with energy from the bridge power supply and with reduced dissipation in the bridge current cells.

The differential stage comprised of transistor 85 and 87 steers a current drawn either from terminal 79 or terminal 81 of FIG. 4 to resistor 86 according to the instantaneous polarity of the bridge output voltage as detected between terminals 8 and 9 of the amplifier, (see FIG. 1), and presented to the bases of transistors 85 and 87 by voltage dividers composed of resistors 83, 84 and resistors 88 and 89. Drawing this current from terminal 79 of FIG. 4 disables current cell 1 (i.e., $I_1$=0) while drawing it from terminal 81 disables current cell 2 (i.e., $I_2$=0).

In the case of a purely resistive load, the leg of the bridge that is disabled is not the leg that, according to signal polarity, must deliver load current. For the resistive case therefore, the operation of the bridge continues much as if the circuit of FIG. 5 were absent. However, when the load is reactive, there are portions of any signal's waveform where the polarity of load current is opposite to the polarity of load voltage. During those portions the upper current cell 1 or 2 of the bridge that would otherwise provide load current is disabled by the circuit of FIG. 5, and the bridge is thereby forced into an unbalanced condition during which energy stored in the load is discharged through either active current cell 3 or 4 in series with the power transistor of the opposite current cell 4 or 3 respectively, depending on signal polarity. No bridge power supply current flows during this interval of intentional unbalance. See FIG. 6 with respect to detailed circuitry suitable for use as the current cells, including MOSFET diodes employed as the power transistors.

Figure 13A:
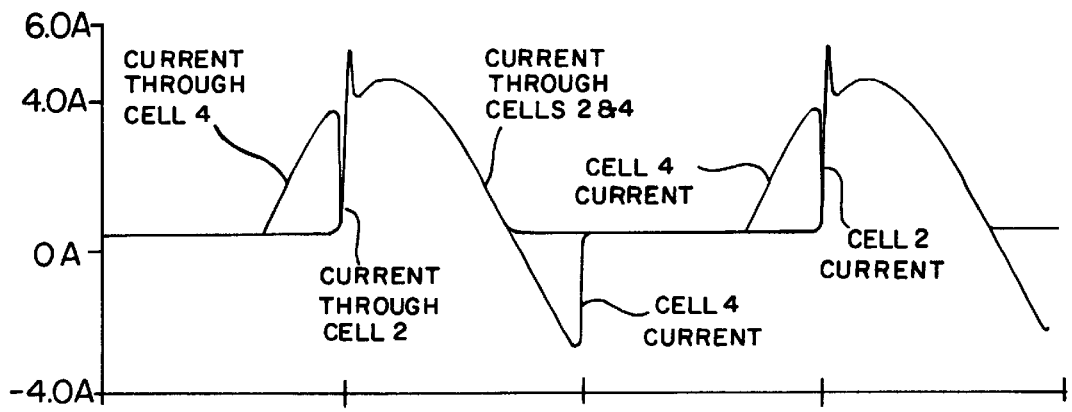
FIGS. 13A–13C are diagrams illustrating exemplary waveforms of currents through adjacent cells (2 and 4 or 1 and 3) and voltage across the cells during a reactive discharge condition.
Figure 13B:
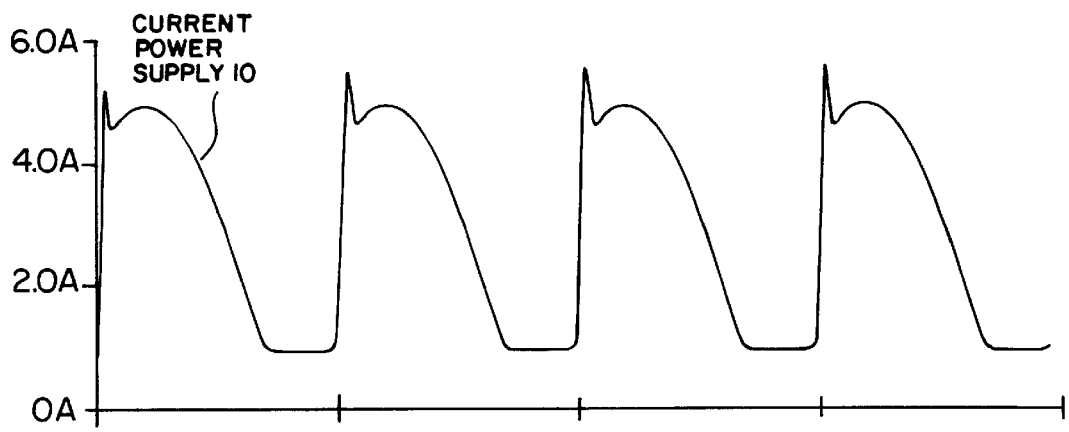
Figure 13C:
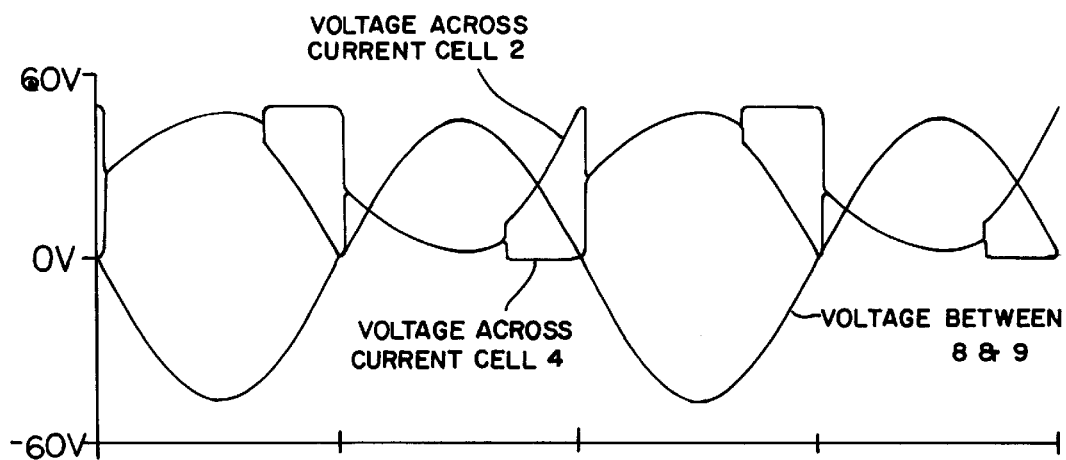

This is illustrated by the waveforms attendant to operating the amplifier with a reactive load causing a 50 degree phase shift between current and voltage, shown on FIGS. 13A–13C. The currents in cells 2 and 4 are shown in FIG. 13A. These currents are always identical when the load is resistive, but as the waveform diagram shows, during the time when the load current and load voltage are of opposite polarity, no current flows in current cell 2. Note the negative current that flows in current cell 4. This is the current flowing in the intrinsic MOSFET diode as the load is being discharged by cells 3 and 4. FIG. 13B shows that the power supply current falls close to zero during the region of opposing polarity. FIG. 13C shows the voltages across current cells 2 and 4. Throughout much of the waveform they are equal, signifying that the bridge is in balance. However, during the intervals of reactive discharge the cell voltages diverge, indicating that the bridge has been temporarily unbalanced.

As a consequence, when the load is reactive, both the power dissipated in the bridge and the power required of the supply are much lower than they would be if the circuit of FIG. 5 were removed from the amplifier.

In practice, the action of the circuit of FIG. 5 may cause some increase in overall system distortion because it violates the isolation between the bridge balancing control system and the system that amplifies the signal. One improvement is to disable it until a specific system temperature is reached. To achieve this result, the resistor 86 may be replaced with a resistor having a resistance which changes in value as a function of temperature.

To reduce the distortion produced by the operation of FIG. 5, a third differential transistor may also be added to create a dead band so that the circuit is disabled during small signals. Alternatively, emitter degeneration resistors may be added to reduce the gain of the circuit and smooth the perturbations it induces in the amplifier's transfer function.

It is to be understood that the circuit of FIG. 5 and its beneficial function and added cost need not be utilized.

Figure 6:
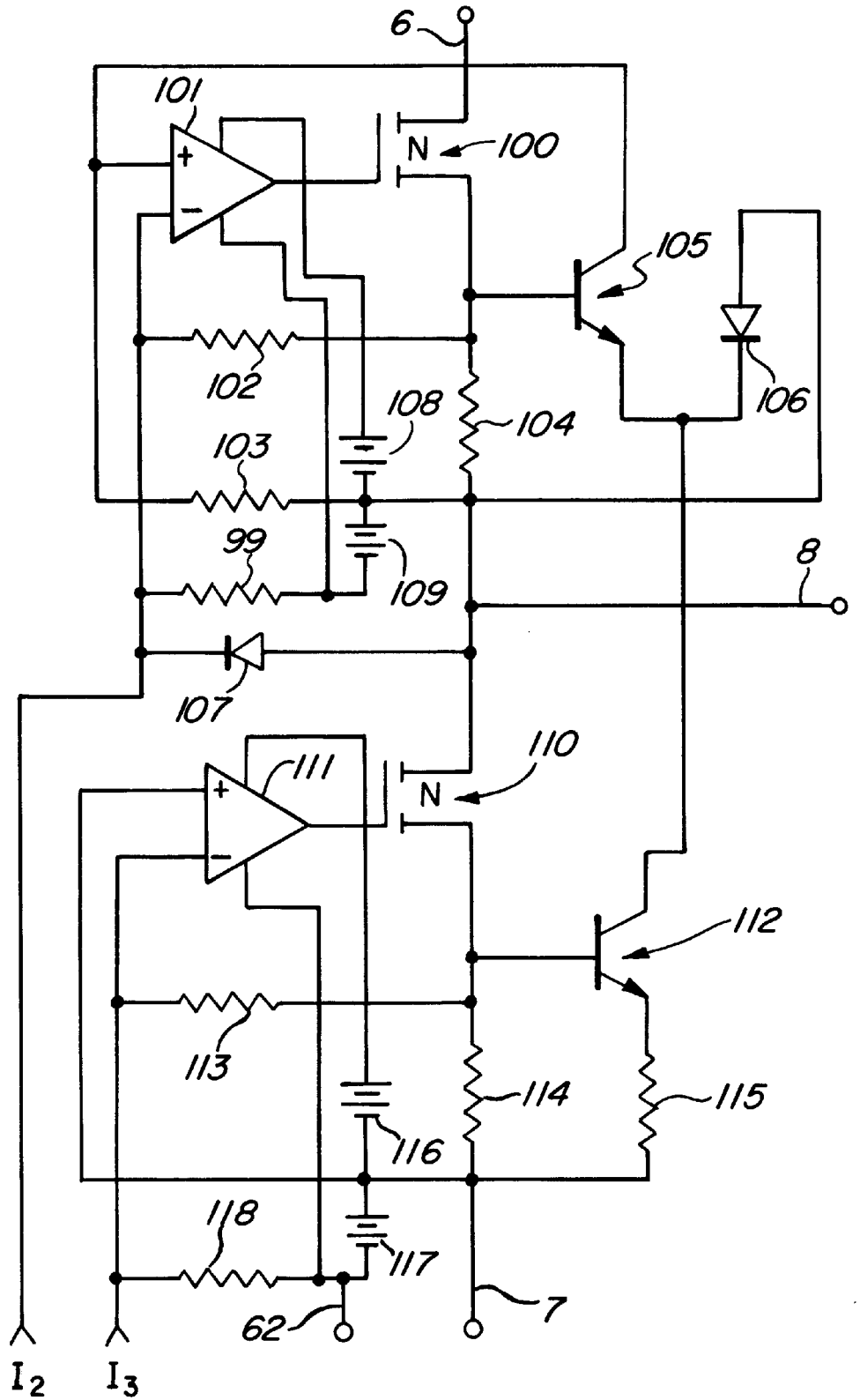
FIG. 6 is a schematic diagram of a preferred current cell for use in the circuit of FIG. 5 for preventing large currents from simultaneously flowing through adjacent current cells connected directly across the power supply terminals.

FIG. 6 illustrates circuitry suitable for use as the current cells. Two operational current cells using Metal Oxide Semiconductor Field Effect Transistors, (MOSFET), as current controlling elements are shown. The MOSFET's are driven by precision servos constructed with monolithic operational amplifiers. Further shown is circuitry for limiting the maximum current passing through one current cell according to the magnitude of current in a second current cell so that large currents cannot flow through both cells at once.

Components 99 through 109 comprise the circuit block current cell 2 of FIG. 1. Components 110 through 118 comprise the circuit block current cell 3 of FIG. 1. The circuitry of FIG. 6 would be duplicated for circuit blocks 1 and 4 of FIG. 1, but will not be discussed in detail since said circuitry is identical.

The basic current amplifying function, well known in the art, is achieved herein by the action of servo amplifier 101 in conjunction with controlled current pass element 100, a MOSFET of suitable power handling capacity. Voltage sources 108 and 109 provide local power to amplifier 101 and are in practice power supplies that may be freely referenced to any electrical reference frame and are here shown referenced to terminal 8 of the circuit. Control current $I_2$ is drawn out of the first terminal of resistor 102, imposing a negative voltage on the inverting input of amplifier 101 with respect to said amplifier's positive input. This causes the output of amplifier 101 to present a positive voltage to the gate of MOSFET 100 causing MOSFET 100 to conduct current. Said current flows through current sensing resistor 104 where it gives rise to a voltage on the second terminal of resistor 102 and this voltage opposes the voltage developed on the first terminal by control current $I_2$. Through this negative feedback mechanism, the current cell servo amplifier 101, acting to maintain its inputs at the same potential, controls the current in resistor 104, and therefore in the MOSFET, to a magnitude proportional to the product of control current $I_2$ and the quotient of resistor 102 divided by resistor 104. The magnitude and accuracy of current gain is limited by the characteristics of amplifier 101 and the precision of resistor 104 and resistor 102. Current gain in excess of 10,000 and accuracy better than 1% is readily achieved. Moreover, since the current in MOSFET 100 is an operational function of drive current $I_2$, its magnitude is independent of changes in the MOSFET's gate/source voltage caused by temperature changes.

The preceding discussion applies as well to amplifier 111 and its similar associated components 110, 113, 114, 116 and 117. The most negative voltage of source 117 is connected to terminal 62, the positive terminal of voltage source 61 of FIG. 3. This establishes electrical reference frames that allow all of the described circuits to operate linearly within their intended voltage ranges.

Resistors 99 and 118 are of relatively high value and supply small minimum control currents to each current cell. This minimum current maintains each current cell in its linear operating region even though control currents $I_2$ and $I_3$ may be reduced to zero.

As shown on FIG. 1, proper load currents must flow through either current cells 1 and 3, or current cells 2 and 4, as a function of polarity. In no circumstance are currents intended to flow vertically through adjacent current cells 1 and 4 connected directly across the power supply terminals, nor are currents to flow through current cells 2 and 3. FIG. 6 discloses circuitry for limiting such potentially destructive error currents to small and safe values. When current flows in resistor 114, and therefore in current cell 3, it is expressed as a voltage across resistor 114 that can become large enough to bias transistor 112 into conduction. Transistor 112 then conducts a current of magnitude inversely proportional to the value of resistor 115 and draws this current from diode 106, chosen to develop a voltage at said current that is lower than the threshold conduction voltage of transistor 105. However, if unintended current begins to flow in resistor 104, the rise in voltage across resistor 104 causes the current to transistor 112 to be diverted from diode 106 through the collector of transistor 105 where it is expressed as a negative voltage (e.g., an inhibit signal) across resistor 103 and applied to the non-inverting input of amplifier 101 causing amplifier 101 to act to reduce (or inhibit) the current in resistor 104. Diode 107 constrains the voltages possible at the inputs of amplifier 101 such that the circuit action described remains valid for the possible magnitudes of control current $I_2$. In summary, the operation of the circuit limits the magnitude of current that can flow simultaneously through resistor 104 and resistor 114 to a safe value, even if control current $I_2$ and control current $I_3$ are somehow activated at the same time.

The protective function described above may be realized in several different ways. Some monolithic amplifiers feature terminals that clamp or disable amplifier operation. In such a case, the current to transistor 112's collector may be directed from such a terminal. In this case, current through resistor 104 may be disabled altogether, but this is merely a special case of arbitrarily limiting said current. The application of this current limiting feature is not limited to use with linear bridge amplifiers. Destructive currents can be prevented from flowing in any bridge amplifier by utilizing a proper current flowing in one quadrant of a bridge to inhibit improper currents in another quadrant of a bridge.

Figure 7:
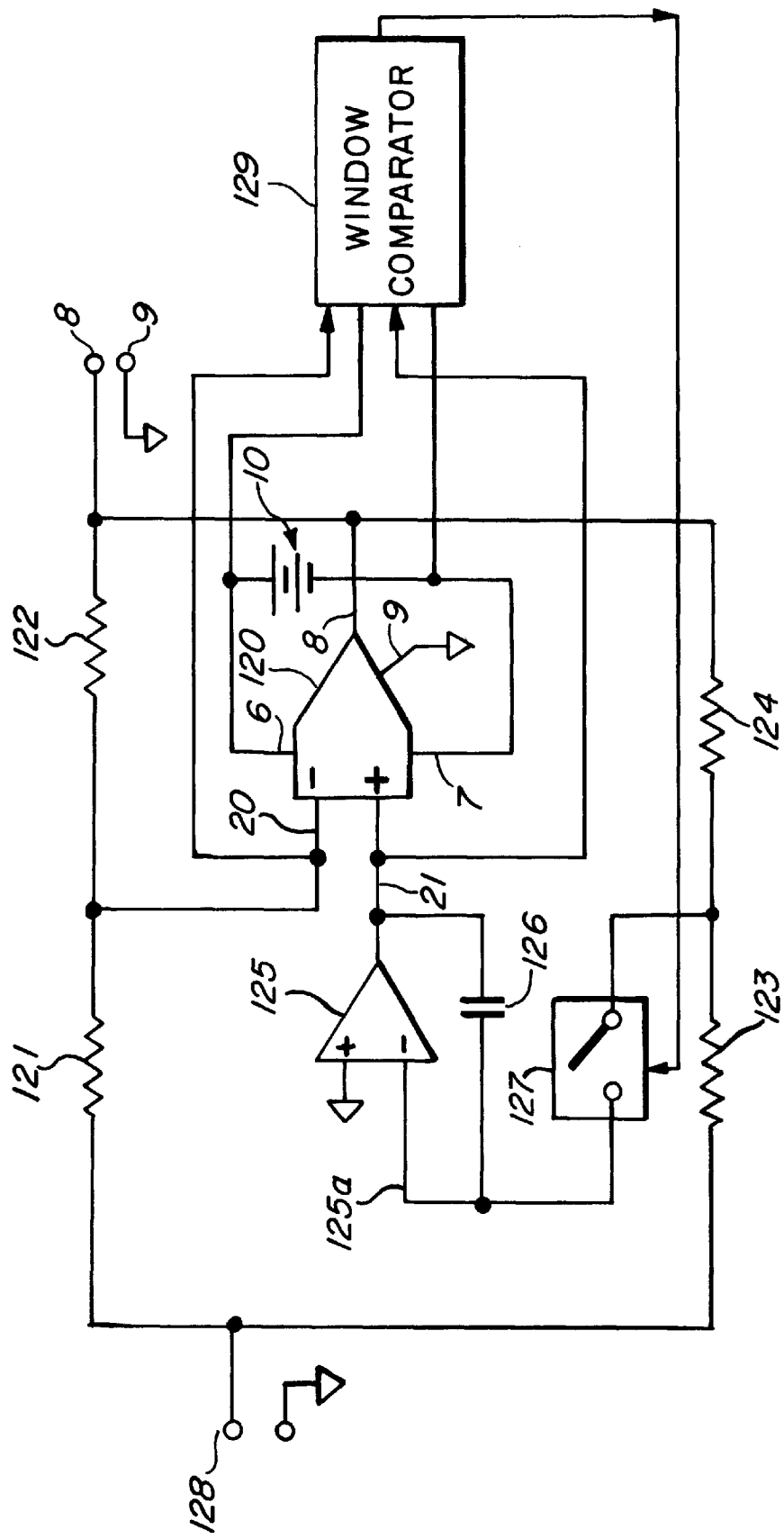
FIG. 7 is a combined block and schematic diagram of a composite amplifier utilizing the core amplifier of FIG. 1 which improves the overall grain and offset error while reducing clipping distorting by overcoming servo saturation.

FIG. 7 illustrates an overall composite amplifier system which incorporates the entire (core) amplifier of FIG. 1 (or any other core amplifier). A amplifier 125 may be a monolithic or operational amplifier (OP AMP) while amplifier 120 is a complex high power amplifier assembled from many components. Amplifier 120 may excel at controlling high currents and voltages but may have relatively low gain and high offset errors. It is well known that a composite amplifier connection such as is shown in FIG. 7 can improve the gain and offset error of the system. A variable impedance device illustrated in the form of a switch 127, overcomes the servo saturation shortcoming of conventional composite amplifiers.

The ratio of resistor 122 and resistor 121 is made equal to the ratio of resistor 124 and resistor 123. Thus, identical but separate feedback signals are applied to the inverting inputs 20 and 125 of amplifier 120 and amplifier 125, respectively. In operation, amplifier 120 behaves as an ordinary amplifier with negative feedback and gain set by the ratio of resistor 122 and 123. With switch 127 closed, amplifier 125 is responsive to the gain-normalized difference between the output of amplifier 120 at terminal 8 and the input signal applied at terminals 128. At D.C. and low frequencies, amplifier 125 amplifies this error term and applies it to the non-inverting input of amplifier 120 in the polarity that tends to reduce the system error. At high frequencies, the presence of integrating capacitor 126 (connected between the amplifier output on line 21 and the inverting input 125a) reduces the gain of amplifier 125 to less than the ratio of resistors 124 and 123, so the composite amplifier's behavior is dominated by that of amplifier 120, Amplifier 125 thus performs band-limited servo correction of amplifier 120.

This circuit is well-behaved as long as amplifier 120 remains within its linear operating region. However, if the input signal at terminals 128 is of such magnitude that amplifier 120 must attempt to reproduce a voltage greater than the voltage of power supply 10, clipping will result. During clipping, a relatively large error is presented to the inverting inputs of both amplifiers. Amplifier 120 can do nothing about the error as it has reached its maximum output voltage, but amplifier 125 (in the absence of switch 127) will respond to the error by ramping the voltage across its integrating capacitor until amplifier 125 reaches its maximum voltage. When the instantaneous input signal drops below the point where clipping occurred, amplifier 120 (in the absence of switch 127) cannot instantly regain normal operation because of the large voltage stored on capacitor 126 and applied to its non-inverting input. The integrator must first ramp back to its valid operating point. This causes the disturbance due to clipping to be stretched in time and increases the clipping distortion and this is an undesirable consequence.

In the present invention, the variable impedance device, illustrated as an electronic switch 127, is opened whenever the output of amplifier 120 approaches to within a few volts of either its most negative or its most positive output voltage (preset limit). The required switch control signal may be readily developed by comparing the instantaneous input signal across core amplifier input terminals 20, 21 with a voltage that is a scaled representation of the voltage of power supply 10 via a known window comparator circuit 129, among other possibilities. When switch 127 is opened at an output voltage just below the point of clipping (i.e., the preset limit), the gain of the integrator formed by amplifier 125 and capacitor 126 becomes zero and the output of amplifier 125 stops changing with time. Amplifier 120 continues to reproduce the input signal, but with no further benefit from the error correction term introduced by amplifier 125. When clipping occurs, amplifier 120 initially behaves as before. Amplifier 125 however, is disconnected from the clipping error term by switch 127 and does not respond to it. Consequently, as soon as the input signal decreases sufficiently, amplifier 120 quickly recovers normal operation and resumes proper signal reproduction. As the signal falls a bit further, switch 127 turns back on and error amplifier 125 resumes its operation at the same voltage where it was suspended. The resulting circuit preserves all of the benefits of the composite amplifier connection but overcomes the increased clipping distortion evidenced by such amplifiers that operate without benefit of the present invention.

As an alternative, the element 127 may be in the form of a variable impedance device, the resistance of which increases from some low finite value to a substantially infinite impedance as the composite amplifier output at terminals 8 and 9 approaches closer to clipping. Such an improvement may mitigate the slight secondary signal perturbations that are due to the interaction of reactive loads with the present circuit.

Figure 8:
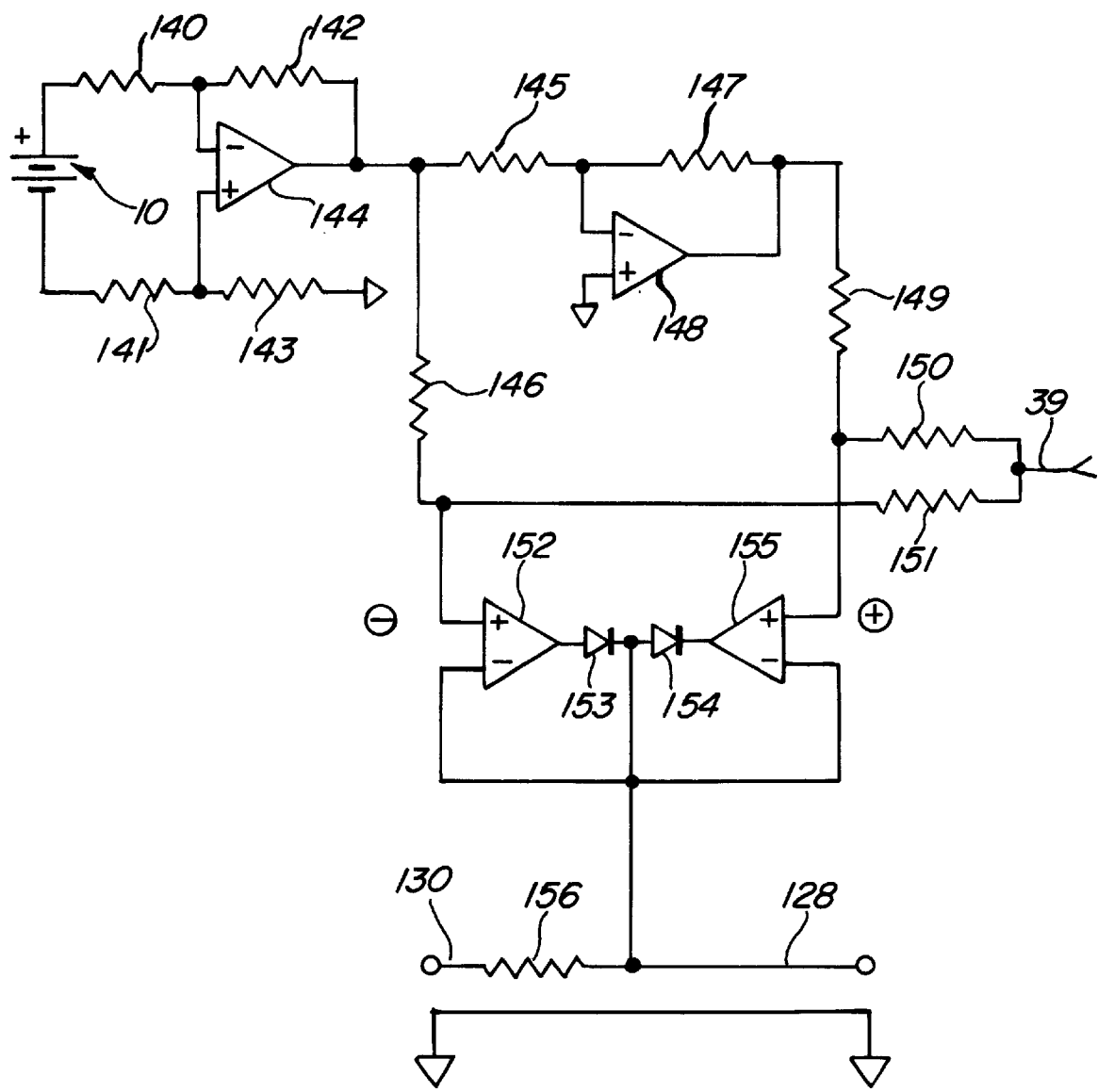
FIG. 8 is a schematic diagram of an alternative circuit for overcoming servo saturation in a composite amplifier.

FIG. 8 shows an alternative circuitry for overcoming servo saturation of the composite amplifier. Rather than interfering with the servo gain during invalid feedback conditions, the circuit of FIG. 8 prevents such conditions in the first place by constraining the excursion of the signal before it is applied to the composite amplifier. By this means, only signals that can be properly reproduced by the amplifier are applied to it. The servo integrator amplifier thus never saturates.

An input signal at terminal 130 that passes through resistor 156 to terminal 128, (the input node of FIG. 7), is clamped between maximum positive and negative voltages that are direct functions of the supply voltage 10, (the bridge supply 10 of FIG. 1), by either diode 153 or 154 according to signal polarity. The diode action is made precise by active clamping obtained by the connection of amplifiers 152 and 153. The negative clamp threshold is developed by differential referencing and scaling of the bridge power supply voltage 10 in the differential amplifier composed of resistor 140, 141, 142, and 143 and amplifier 144. The ground referenced negative output voltage of amplifier 144 is inverted by amplifier 148 to provide the positive clamp threshold. Both thresholds dynamically follow the voltage of bridge power supply 10.

A loaded power amplifier exhibits a difference between its maximum output voltage and its supply voltage that is due to resistive drops and, in the case of conventional amplifiers, to junction drops as well. In all cases the total voltage drop is some direct function of load current. To ensure that the system can always achieve the largest output voltage possible consistent with no loss of servo feedback, a compensating offset is applied to both clamp thresholds. Terminal 39, the output of current monitoring amplifier of FIG. 2, drives the end terminals of attenuating resistor networks 146 and 151, and like network 149 and 150. The polarity of the signal at terminal 39 opposes that of the signal at 130, so that as current rises, the threshold voltages applied to amplifiers 152 and 155 are suitably reduced. The attenuation inherent in the networks is a scaling error, and any undesirable portion of that may be corrected by suitable choice of scaling in the network surrounding amplifier 144.

Figure 9:
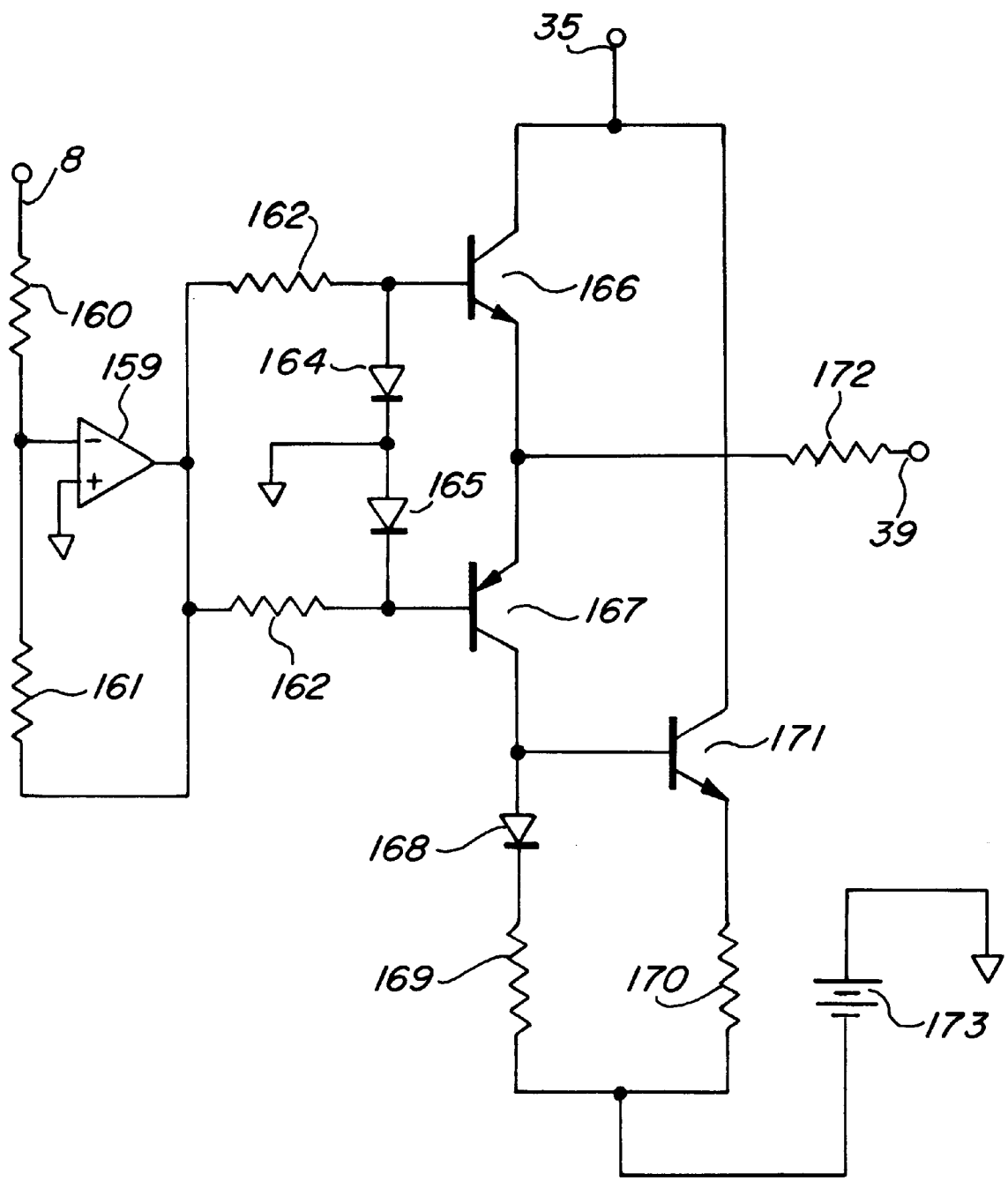
FIG. 9 is a schematic diagram of a circuit for use in the core amplifier of FIG. 1 for controlling the magnitude of the control current in the circuit of FIG. 2 in accordance with the magnitude of the load current and load voltage.

FIG. 9 shows circuitry for detecting when a scaled representation of the load current exceeds a scaled representation of the load voltage to initiate a reduction in the control current $I_a$ (and the bridge current) when the load impedance is lower than a preset value. The circuitry compares the magnitude of the voltage proportional to load current at terminal 39 and power supply output voltage at terminal 8 for the purpose of generating a supervisory current to terminal 35 of FIG. 2 that will act to reduce the maximum current that the amplifier of FIG. 1 can deliver to load 5. It should be noted that under this condition the preset gain of the transconductance amplifier is reduced.

The output voltage at terminal 8 is applied to an inverting attenuation network consisting of resistors 161, 160 and amplifier 159. The output of amplifier 159 is applied to the base of transistor 166 through resistor 162 and is constrained to mostly negative voltages by the clamping action to ground of diode 164. The same output is similarly applied to the base of transistor 167 but is substantially constrained to positive voltages by diode 165. A voltage on terminal 39, proportional to the current in load 5, is simultaneously applied to the emitters of transistor 166 and transistor 167 through current scaling resistor 172. The voltage 39 and the output of amplifier 159 are in phase when load 5 is resistive. Whenever the magnitude of the voltage at terminal 39 exceeds the magnitude of the output of amplifier 159 plus a semiconductor junction drop, transistor 166 or transistor 167 conduct a current inversely proportional to that present in resistor 172. When the magnitude and polarity of signals is such that transistor 167 conducts, a current mirror composed of compensating diode 168, resistor 169 and resistor 170, and transistor 171 draws an identical current from terminal 35. When transistor 166 conducts, current is directly drawn from terminal 35. The result is that current flows from terminal 35 whenever the magnitude comparison of the current through load 5 and the scaled and inverted voltage across load 5 assumes a sufficient value. Voltage source 173 has a value sufficient to permit unsaturated operation of transistors 167 and 171 under all signal conditions.

The consequence of drawing current from terminal 35 is previously described above for the circuit of FIG. 2. The integrating effect of capacitor 33 causes the overall amplifier current cutback control loop formed by the circuits of FIGS. 2 and 9 to ignore occasional (or transient) combinations of large phase shift and large currents in the load 5. Sustained adverse conditions that might otherwise overheat the amplifier's output devices are detected and the amplifier's maximum output current is reduced, but the reduction is not regenerative. This is desirable because it makes recovery automatic once normal conditions are restored.

There has thus been described a high power amplifier particularly suitable for driving large venue speaker systems which incorporates novel circuit topologies for (a) producing internal drive control signals, (b) producing signals representative of the load voltage and current to facilitate external system monitoring, (c) efficiently handling partially reactive loads, and (d) for protecting the amplifier from failure when abnormal operating conditions are encountered. Various modifications and improvements to the circuitry described herein will become apparent to those skilled in the art without involving a departure from the spirit and scope of the invention as defined in the appended claims.

What is claimed is:

1. A bridge amplifier for delivering current to a load from a power supply, the load current varying in accordance with an input voltage signal $V_1$ comprising:

a plurality of current cells arranged in a bridge configuration with at least one cell delivering current to the load during one half cycle and at least one other cell delivering current to the load during the other half cycle of the input voltage signal, the current flow through each cell being proportional to an input drive current;

an input voltage signal to control current converter having a pair of input terminals for receiving the input signal and an output circuit for providing at least one output control current representative of the input voltage signal; and a class A to class B drive current converter responsive to the output control current for providing at least two separate bridge drive currents with each drive current having a finite value for substantially only alternate half cycles, the difference between the bridge drive currents being proportional to the output control current, one of the drive currents being supplied to said at least one cell and the other drive current being supplied to said at least one other current cell, whereby said at least one cell supplies current to the load during one half cycle of the input voltage signal and said at least one other current cell supplies current to the load during the other half cycle.

2. The invention of claim 1 further including means coupled to the input terminals of the input voltage signal/control current converter for providing a load current monitoring signal representative of the load current.

3. The invention of claim 2 further including load current limiting means responsive to the load current monitoring signal and the voltage across the load for reducing the magnitude of the control current independently of the input signal $V_1$ when the load impedance falls below a preset value.

4. The invention of claim 3 wherein the load current limiting means includes integrating circuitry for accommodating transient changes in the load impedance.

5. The invention of claim 4 wherein the load current monitoring signal means provides a signal $V_{LI}$ representative of the magnitude of the load current, wherein the magnitude of the voltage across the load is represented by $V_{LV}$ and further including:

means for integrating the magnitude of $V_{LI}$–the magnitude of $V_{LV}$; and means responsive to the integral of $V_{LI}$–$V_{LV}$ for reducing the output control current from the input voltage signal/control current converter.

6. The invention of claim 1 wherein the input/control current converter provides two output control currents $I_b$ and $I_c$.

7. The invention of claim 6 wherein the input voltage/control current converter comprises:

a source of direct current $I_a$; and a differential circuit having a current input terminal connected to the direct current source, a pair of input voltage signal terminals for receiving the input voltage signal and first and second current output terminals, the differential circuit being arranged to provide output currents, $I_b$ and $I_c$ in the first and second current output terminals, respectively, in which $I_b+I_c$ is proportional to $I_a$ and $I_b-I_c$ is proportional to $V_1$.

8. The invention of claim 7 wherein the differential circuit comprises a pair of variable impedance devices, each device having an output circuit connected between the direct current source and a respective current output terminal and an input circuit, one input voltage terminal being connected to one input circuit of one device and the other input voltage terminal being connected to the input circuit of the other device, the impedance in the output circuits varying in accordance with the amplitude of the signal applied to the respective input circuits.

9. The invention of claim 8 wherein each variable impedance device comprises a bipolar transistor with the emitter and collector thereof connected in series relationship between the direct current source and the respective current output terminal, the base of each transistor being connected to a respective input terminal.

10. The invention of claim 6 wherein the class A to class B drive current converter includes a nonlinear differential circuit having a pair of output terminals for providing bridge drive current $I_g$ and $I_h$ with $I_g$ being proportional to $I_b-I_c$ during one half cycle, $I_h$ being proportional to $I_c-I_b$ during the other half cycle.

11. The invention of claim 6 wherein the class A to class B current converter further includes a summing circuit for providing a direct current $I_d$ proportional to $I_b$ and $I_c$, and an additional differential amplifier for producing currents $I_e$ and $I_f$, the currents $I_e$ and $I_f$ being mirrored proportional replications of currents $I_b$ and $I_c$ supplied to the nonlinear differential circuit.

12. The invention of claim 10 wherein the nonlinear differential circuit comprises a pair of bipolar transistors connected in an emitter follower configuration with the collectors forming the output terminals, the emitter of each transistor being coupled to the base of the other transistor whereby current flow through the collector/emitter of one transistor limits the current flow through the collector/emitter of the other transistor.

13. The invention of claim 12 wherein each emitter is coupled to the base of the other transistor via a diode so that current flow through the collector/emitter of one transistor will reduce the bias voltage across the base emitter junction of the other transistor, whereby substantial current will flow through only one transistor at a time.

14. The invention of claim 13 wherein the change in the forward bias voltages due to temperature changes across the diodes are substantially equal to the change in forward bias voltages due to temperature changes across the base emitter junctions of the transistors to render the nonlinear differential circuit substantially insensitive to temperature variations.

15. The invention of claim 1 wherein each current cell is further responsive to a bias control current in addition to the input drive current and further including bias means for supplying a small bias control current to each cell to maintain each cell within it's linear operating region notwithstanding the reduction to zero of the input drive current thereto to thereby reduce distortion.

16. The invention of claim 1 wherein the bridge amplifier is a full-bridge amplifier, said at least one current cell comprising first and third cells and said at least one other current cell comprising second and fourth current cells so that the first and third and the second and fourth cells alternately deliver current to the load from the power supply.

17. The invention of claim 16 wherein the power supply is connected across two terminals and the load is connected across two terminals, each current cell having an input for receiving the drive current and wherein the drive currents are supplied to each pair of diagonally opposite current cells (first and third or second and fourth) by a differential circuit which divides the respective class B drive currents between the inputs of the diagonally opposite current cells in accordance with the voltages present across the power supply and load terminals to reduce any unbalance of the bridge.

18. The invention of claim 17 wherein each differential circuit includes a pair of bipolar transistors with the bias voltage across the base emitter junction of one transistor being proportional to the instantaneous sum of the voltages present on the two power supply terminals and the bias voltage across the base emitter junction of the other transistor being proportional to the instantaneous sum of the voltages present on the two load terminals, whereby the drive current is proportionally steered between current cells to reduce any bridge unbalance.

19. The invention of claim 16 further including a reactive load control circuit responsive to the polarity of the current flow through the load and polarity of the voltage across the load terminals for preventing current flow from the power supply when the polarity of load current and load voltage are opposite.

20. The invention of claim 19 wherein the reactive load control circuit comprises a differential circuit which forces the bridge into an unbalanced condition so that energy stored in the load is discharged through two adjacent cells connected between one of the power supply terminals and to respective load terminals when the polarity of the load current is opposite the polarity of the load voltage.

21. The invention of claim 16 wherein one current cell of each adjacent pair connected across the power supply terminals (second and third or first and fourth) is responsive to an inhibit signal to inhibit the flow of current through said one current cell notwithstanding the presence of an input drive current to said one cell and further including means for applying the inhibit signal to said one cell in response to current flow through the other cell of said adjacent pair to prevent any substantial current from simultaneously flowing through adjacent current cells.

22. The invention of claim 21 wherein each current cell comprises a MOSFET having an output circuit through which current flows to the load in accordance with a control signal applied to the gate electrode thereof and an OP AMP responsive to the input drive current for supplying a control signal to the gate electrode.

23. The invention of claim 22 wherein at least one of the current cells is responsive to an inhibit signal for inhibiting the current through said at least one cell notwithstanding the presence of a drive current to said at least one cell and wherein the OP AMP associated with said at least one cell is responsive to said inhibit signal.

24. The invention of claim 23 further including bias means for maintaining said at least one OP AMP and it's respective MOSFET's in it's linear operating range.

25. The invention of claim 16 wherein each current cell is further responsive to bias control current in addition to the input drive current and further including bias means for supplying a small bias control current to each cell to maintain each cell within it's linear operating region notwithstanding the reduction to zero of the input drive current thereto to reduce distortion.

26. The invention of claim 1 further including:
an operational amplifier having an input and an output connected to the input terminals of the input voltage/control current converter to form a composite amplifier;
a composite amplifier input for receiving input signals to be amplified by the composite amplifier, the composite amplifier input being coupled to the input terminals of the input voltage/control current converter and to the input of the operational amplifier;
a negative feedback network for providing separate and substantially identical feedback signals to the operational amplifier input and to input terminals of the input voltage/control current converter;
a capacitor coupled to the operational amplifier to form an integrator for limiting the gain of the operational amplifier at high frequencies; and
a variable impedance device connected in series relationship with the operational amplifier input to control the amplitude of the signals applied thereto, the variable impedance device being responsive to the peak amplitude of the composite amplifier input signal whereby the gain of the integrator formed by the operational amplifier and capacitor is decreased when the peak amplitude of the composite amplifier input signal reaches a preset limit.

27. The invention of claim 26 wherein the variable impedance device is an electronic switch, the switch being closed and opened when the peak amplitude of the composite amplifier input signal is below and above said preset limit, respectively.

28. The invention of claim 1 further including:
an operational amplifier having an input and an output connected to the input terminals of the input voltage/control current converter to form a composite amplifier;
a composite amplifier input for receiving input signals to be amplified by the composite amplifier, the composite amplifier input being coupled to the input terminals of the input voltage/control current converter and to the input of the operational amplifier;
a negative feedback network for providing separate and substantially identical feedback signals to the operational amplifier input and to input terminals of the input voltage/control current converter; and
input signal clamping means connected to the composite amplifier input and responsive to the instantaneous values of the input signal and the power supply voltage for limiting the positive and negative excursions of the input signal to prevent clipping.

29. The invention of claim 28 further including means for providing a load current monitoring voltage signal representative of the load current and wherein the clamping means is further responsive to the load current monitoring signal for limiting the input signal in accordance with the supply voltage and the load current to compensate for voltage drops within the current cells.

30. The invention of claim 8 further wherein the differential circuit of the input voltage/control current converter includes an individual resistive element connected in series relationship between the direct current source and the output circuit of a respective variable impedance device and an instrumentation amplifier having an input circuit coupled to the resistive elements and an output, the amplifier being responsive to the difference in the voltages across the resistive elements for providing a voltage signal $V_{LI}$ in the output thereof representative of the magnitude of the current through the load.

31. The invention of claim 30 further including:
means for providing a load voltage signal $V_{LV}$ representative of the magnitude of the voltage across the load;
detecting means for detecting when the magnitude of $V_{LI}$ is greater than the magnitude of $V_{LV}$;
integrating means for integrating the magnitude of $V_{LI}$–the magnitude of $V_{LV}$; and
means responsive to the integral of the magnitude of $V_{LI}$–$V_{LV}$ for reducing the output control current from input voltage signal/control current convertor.

32. The invention of claim 31 wherein means responsive to the integral of the magnitude of $V_{LI}$–$V_{LV}$ decreases the value of $I_a$ when said integral reaches a preset value.

33. In a bridge amplifier utilizing bridged current cells responsive to drive currents for delivering current to the load proportional to a signal input voltage $V_1$, the improvement of an input signal voltage to drive current converter comprising:

a source of direct current $I_a$;

a differential circuit having a current input terminal connected to the direct current source, a pair of signal input terminals for receiving the input voltage signal and first and second current output terminals, the differential circuit being arranged to provide output currents, $I_b$ and $I_c$ in the first and second current output terminals, respectively, in which $I_b+I_c$ is proportional to $I_a$ and $I_b-I_c$ is proportional to $V_1$; and means coupled to the signal input terminals for providing a load current monitoring voltage signal representative of the load current and the amplifier transfer function, the load current limiting means being responsive to the load current monitoring signal and to the load voltage for limiting the magnitude of the load current independently of the input voltage signal $V_1$.

34. In a full bridge transconductance amplifier having a preset gain with first, second, third and fourth current cells arranged in a bridge configuration with a power supply connected across two terminals of diagonally opposite current cells (first and third and second and fourth) the junction of the diagonally opposite current cells forming two load terminals therebetween, each current cell having an input for receiving a drive current with the current flow through each cell being proportional to the drive current applied to the input thereof and wherein a pair of class B drive currents are alternately supplied from separate class B drive current sources to the inputs of diagonally opposite current cells, the improvement of a bridge balancing circuit comprising:

an individual differential circuit coupled between the inputs of each pair of diagonally opposite current cells and a respective drive current source, each differential circuit being responsive to voltages across the power supply and load terminals to allocate the drive current to the inputs of the respective pair of diagonally opposite current cells to reduce any unbalance of the bridge.

35. An audio full bridge amplifier for delivering current to a load from a power supply, the load current varying in accordance with an audio input voltage signal $V_1$ comprising:

first, second, third, and fourth current cells arranged in a bridge configuration with the first and third cells and the second and fourth cells alternately delivering current to the load from the power supply, the current flow through each cell being proportional to an input drive current;

an audio input voltage signal to control current converter having a pair of audio input terminals for receiving the audio input signal and an output circuit for providing at least one output control current representative of the audio input signal; and a class A to class B drive current converter responsive to the output control current for providing two bridge drive currents with each drive current having a finite value for substantially only alternate half cycles, the difference between the bridge drive currents being proportional to the output control current, one of the drive currents being supplied to the first and third current cells and the other drive current being supplied to the second and fourth current cells, whereby the first and third current cells supply current to the load during one half cycle of the audio input and the second and fourth current cells supply current to the load during the other half cycle.

36. The invention of claim 35 wherein the audio input/control current converter provides two output control currents $I_b$ and $I_c$.

37. The invention of claim 36 wherein the audio input/control current converter comprises:

a source of direct current $I_a$; and a differential circuit having a current input terminal connected to the direct current source, a pair of audio signal input terminals for receiving the audio input voltage signal and first and second current output terminals, the differential circuit being arranged to provide output currents, $I_b$ and $I_c$ in the first and second current output terminals, respectively, in which $I_b+I_c$ is proportional to $I_a$ and $I_b-I_c$ is proportional to $V_1$.

38. The invention of claim 36 wherein the class A to class B drive current converter includes a nonlinear differential circuit having a pair of output terminals for providing bridge drive current $I_g$ and $I_h$ with $I_g$ being proportional to $I_b-I_c$ during one half cycles, $I_h$ being proportional to $I_c-I_b$ during the other half cycle and $I_g+I_h$ being proportional to $I_d$.

39. The invention of claim 38 wherein the power supply is connected across two terminals and the load is connected across two terminals, each current cell having an input for receiving the drive current and wherein the drive currents are supplied to each pair of diagonally opposite current cells (first and third or second and fourth) by a differential circuit which divides the respective class B drive currents between the inputs of the diagonally opposite current cells in accordance with the voltages present across the power supply and load terminals to reduce any unbalance of the bridge.

40. The invention of claim 39 wherein one current cell of each adjacent pair connected across the power supply terminals (second and third or first and fourth) is responsive to an inhibit signal to inhibit the flow of current through said one current cell notwithstanding the presence of an input drive current to said one cell and further including means for applying the inhibit signal to said one cell in response to current flow through the other cell of said adjacent pair to prevent any substantial current from simultaneously flowing through adjacent current cells.

41. The invention of claim 39 further including:

an operational amplifier having an input and an output connected to the audio input terminals of the audio input voltage/control current converter to form a composite amplifier, a composite amplifier input for receiving audio signals to be amplified by the composite amplifier, the composite amplifier input being coupled to the audio input terminals of the audio input voltage/control current converter and to the input of the operational amplifier;

a negative feedback network for providing separate and substantially identical feedback signals to the operational amplifier input and to input terminals of the audio input voltage/control current converter;

a capacitor connected between the output and input of the operational amplifier to form an integrator for limiting the gain of the operational amplifier at high frequencies; and a variable impedance device connected in series relationship with the operational amplifier input to control the amplitude of the signals applied thereto, the variable impedance device being responsive to the peak amplitude of the composite amplifier input signal whereby the gain of the integrator formed by the operational amplifier and capacitor is decreased when the peak amplitude of the composite amplifier input signal reaches a preset limit.

* * * * *

UNITED STATES PATENT AND TRADEMARK OFFICE
CERTIFICATE OF CORRECTION

PATENT NO. : 6,023,193
DATED : 2/8/00
INVENTOR(S) : Paul F. Ierymenko

It is certified that error appears in the above-indentified patent and that said Letters Patent is hereby corrected as shown below:

Column 6, line 1, "FIGS. 3A and 3B are schematic diagram" should read
--FIGS. 3 and 3A are schematic diagrams--.

Column 6, line 51, after "configuration" delete "4".

Signed and Sealed this

Twenty-seventh Day of February, 2001

Attest:

NICHOLAS P. GODICI

Attesting Officer     Acting Director of the United States Patent and Trademark Office